United States Patent
Pforr et al.

(10) Patent No.: US 8,871,409 B2
(45) Date of Patent: Oct. 28, 2014

(54) LITHOGRAPHIC TARGETS FOR UNIFORMITY CONTROL

(75) Inventors: Rainer Pforr, Dresden (DE); Guy Ben-Zvi, Shechania (IL); Vladimir Dmitriev, Karmiel (IL); Erez Graitzer, Gilon (IL)

(73) Assignee: Carl Zeiss SMS Ltd., Karmiel (IL)

( * ) Notice: Subject to any disclaimer, the term of this patent is extended or adjusted under 35 U.S.C. 154(b) by 108 days.

(21) Appl. No.: 13/810,974

(22) PCT Filed: Jul. 25, 2011

(86) PCT No.: PCT/EP2011/062761
§ 371 (c)(1),
(2), (4) Date: Jun. 21, 2013

(87) PCT Pub. No.: WO2012/013638
PCT Pub. Date: Feb. 2, 2012

(65) Prior Publication Data
US 2013/0295698 A1    Nov. 7, 2013

Related U.S. Application Data

(60) Provisional application No. 61/367,660, filed on Jul. 26, 2010.

(51) Int. Cl.
| | | |
|---|---|---|
| G03F 1/00 | (2012.01) | |
| G03C 5/00 | (2006.01) | |
| G03F 7/00 | (2006.01) | |
| H01L 21/66 | (2006.01) | |
| H01L 21/68 | (2006.01) | |
| G03F 1/38 | (2012.01) | |
| G03F 1/44 | (2012.01) | |
| G03F 7/20 | (2006.01) | |
| G06F 17/50 | (2006.01) | |

(52) U.S. Cl.
CPC ........... *H01L 22/12* (2013.01); *H01L 21/68* (2013.01); *H01L 21/681* (2013.01); *H01L 22/20* (2013.01); *H01L 21/682* (2013.01); *G03F 1/38* (2013.01); *G03F 1/44* (2013.01); *G03F 7/70616* (2013.01); *G03F 7/70625* (2013.01); *G03F 7/70633* (2013.01); *G03F 7/70683* (2013.01); *G06F 17/50* (2013.01)
USPC ............... 430/5; 430/30; 430/270.1; 438/14

(58) Field of Classification Search
CPC ..... H01L 21/68; H01L 21/681; H01L 21/682; H01L 21/0274; H01L 22/12; H01L 22/20; H01L 22/26; H01L 22/34; H01L 22/544; G03F 1/30; G03F 1/32; G03F 1/0061; G03F 1/144; G03F 7/705
USPC ............................ 430/5, 30, 270.1; 438/14
See application file for complete search history.

(56) References Cited

U.S. PATENT DOCUMENTS

| | | |
|---|---|---|
| 4,479,711 A | 10/1984 | Kosugi et al. |
| 5,242,770 A * | 9/1993 | Chen et al. ............ 430/5 |

(Continued)

OTHER PUBLICATIONS

International Search Report and Written Opinion dated Oct. 21, 2011 for corresponding application PCT/EP2011/062761.

(Continued)

*Primary Examiner* — Karen Kusumakar
(74) *Attorney, Agent, or Firm* — Fish & Richardson P.C.

(57) ABSTRACT

A photo mask having a first set of patterns and a second set of patterns is provided in which the first set of patterns correspond to a circuit pattern to be fabricated on a wafer, and the second set of patterns have dimensions such that the second set of patterns do not contribute to the circuit pattern that is produced using a lithography process based on the first set of patterns under a first exposure condition. The critical dimension distribution of the photo mask is determined based on the second set of patterns that do not contribute to the circuit pattern produced using the lithography process based on the first set of patterns under the first exposure condition.

48 Claims, 21 Drawing Sheets

(56) References Cited

U.S. PATENT DOCUMENTS

| | | | |
|---|---|---|---|
| 6,068,954 A * | 5/2000 | David | 430/22 |
| 6,117,600 A * | 9/2000 | Nakasuji | 430/30 |
| 6,777,144 B2 * | 8/2004 | Honeycutt et al. | 430/22 |
| 2002/0031712 A1 * | 3/2002 | Tani | 430/5 |
| 2002/0182545 A1 * | 12/2002 | Minami et al. | 430/311 |
| 2003/0034570 A1 * | 2/2003 | Baggenstoss | 257/797 |
| 2003/0036007 A1 * | 2/2003 | Baggenstoss | 430/30 |
| 2009/0075178 A1 | 3/2009 | Jahnke et al. | |

OTHER PUBLICATIONS

Bertrand Le Gratiet et al: "Improved CD control for 45-40 nm CMOS logic patterning: anticipation for 32-28 nm", Proceedings of SPIE, Jan. 1, 2010, pp. 76380A-76380A-11, XP55008839, ISSN: 0277-786X.

Rainer Pforr et al: "Performance comparison of techniques for intra-field CD control improvement", Proceedings of SPIE, vol. 6730, Jan. 1, 2007, pp. 673032-673032-9, XP55009019, ISSN: 0277-786X.

Ausschnitt et al., "Multi-layer Overlay Metrology", Proc. SPIE 6152, pp. 1-10, Feb. 2006.

* cited by examiner

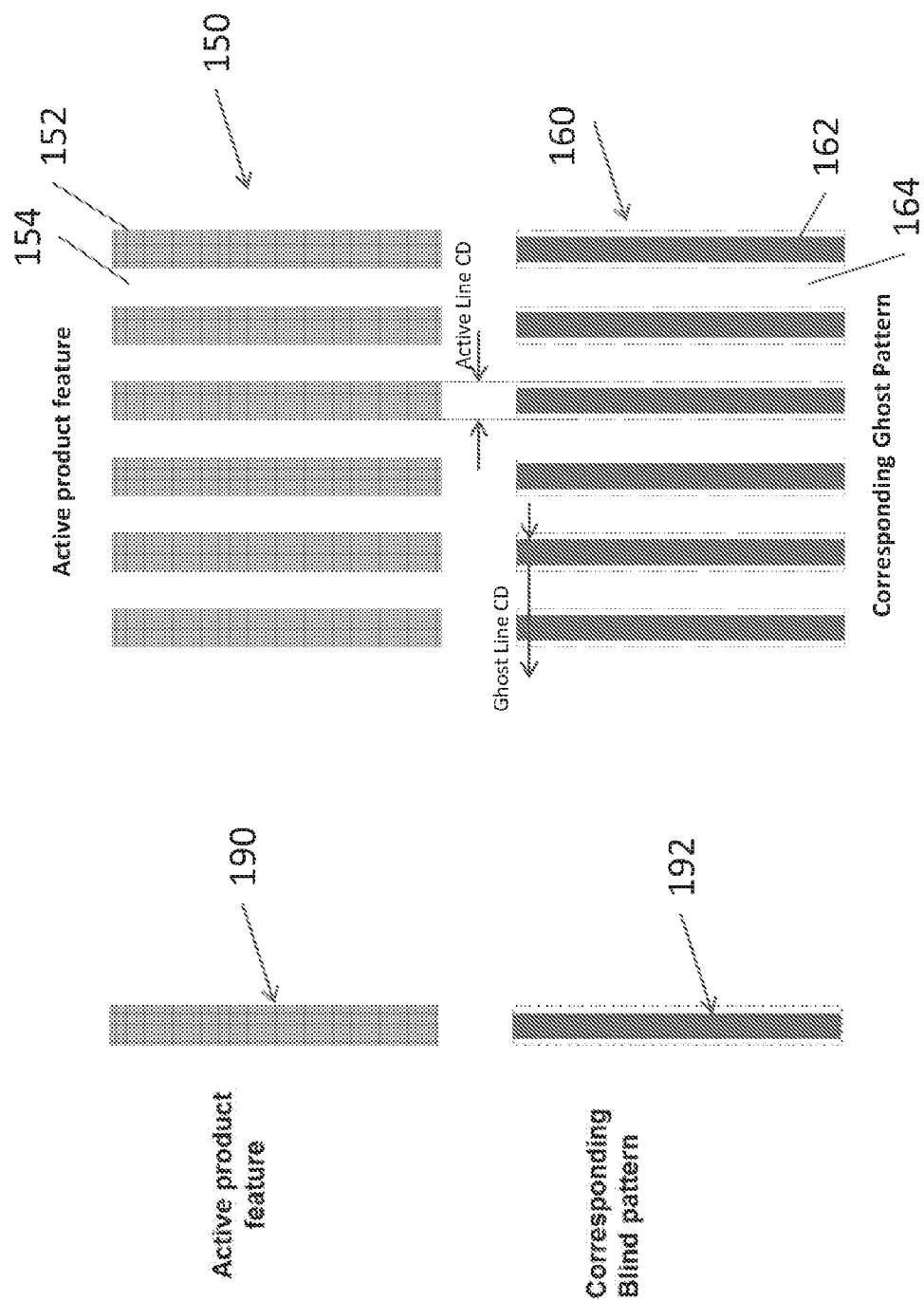

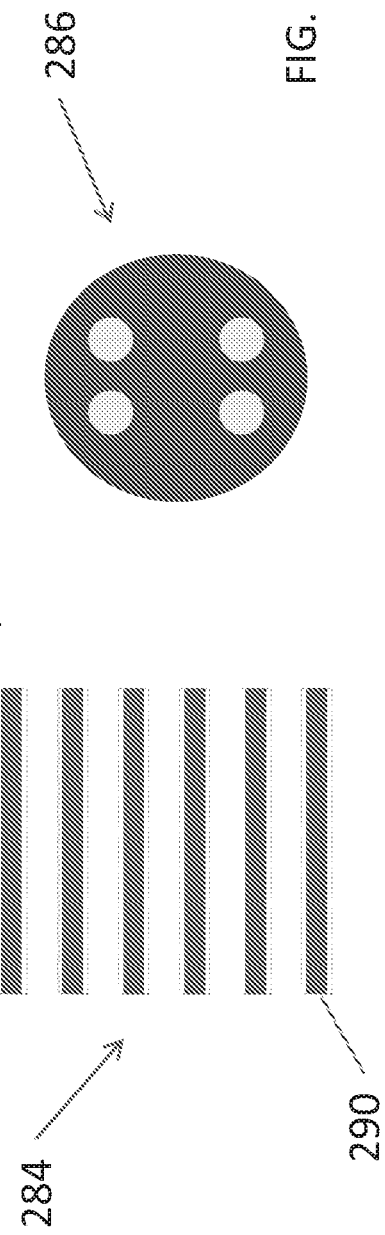
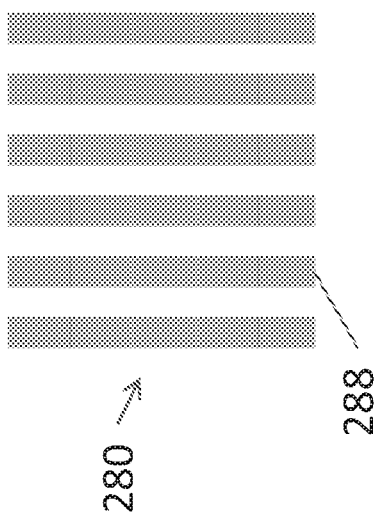
FIG. 9

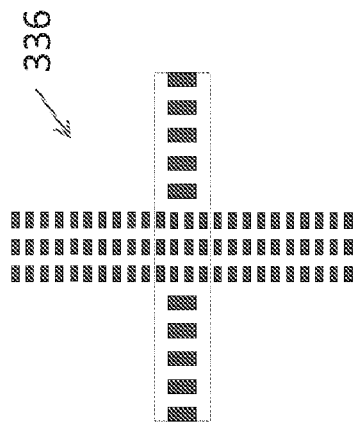
FIG. 14A
FIG. 14B
FIG. 14C
FIG. 14D

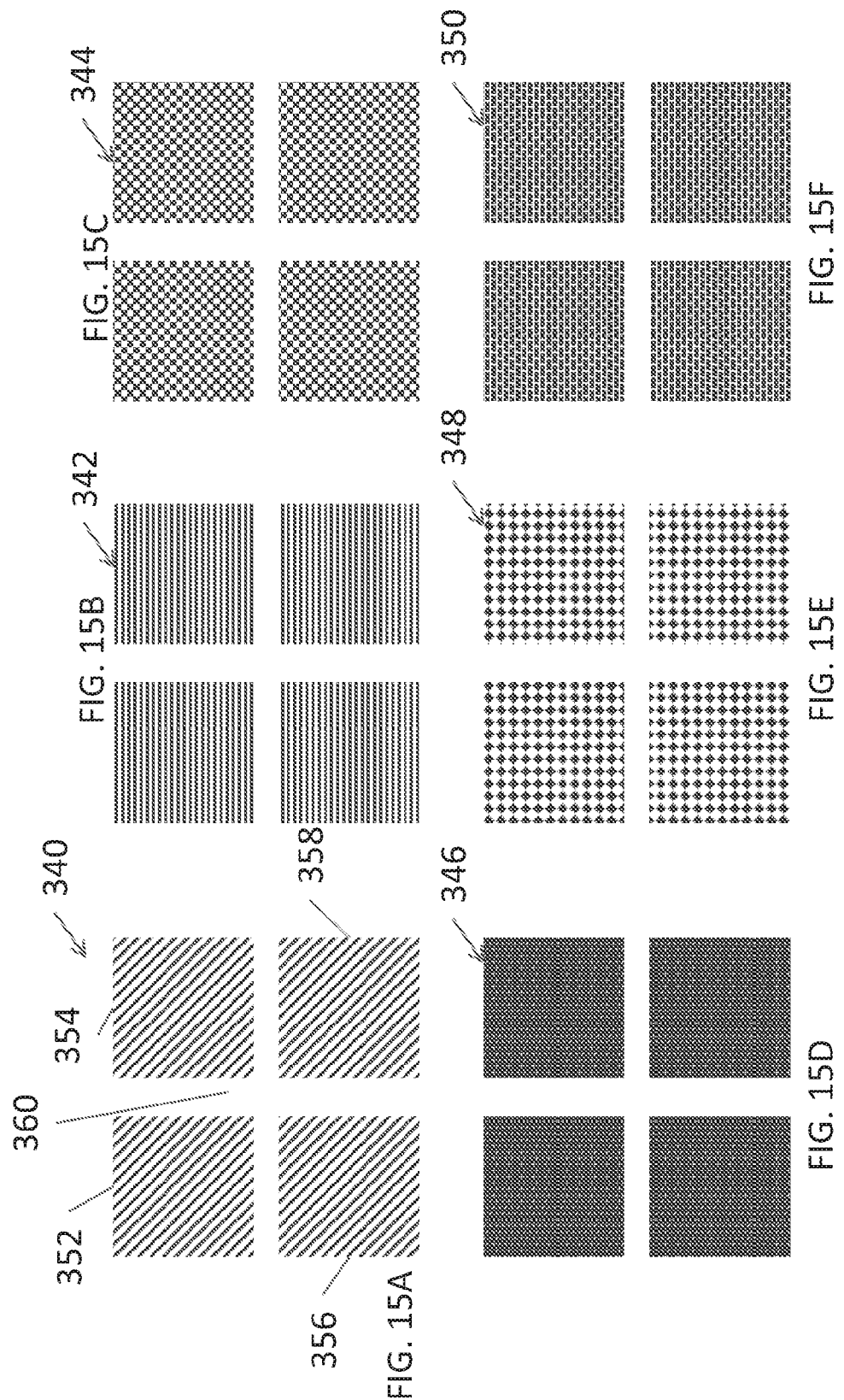

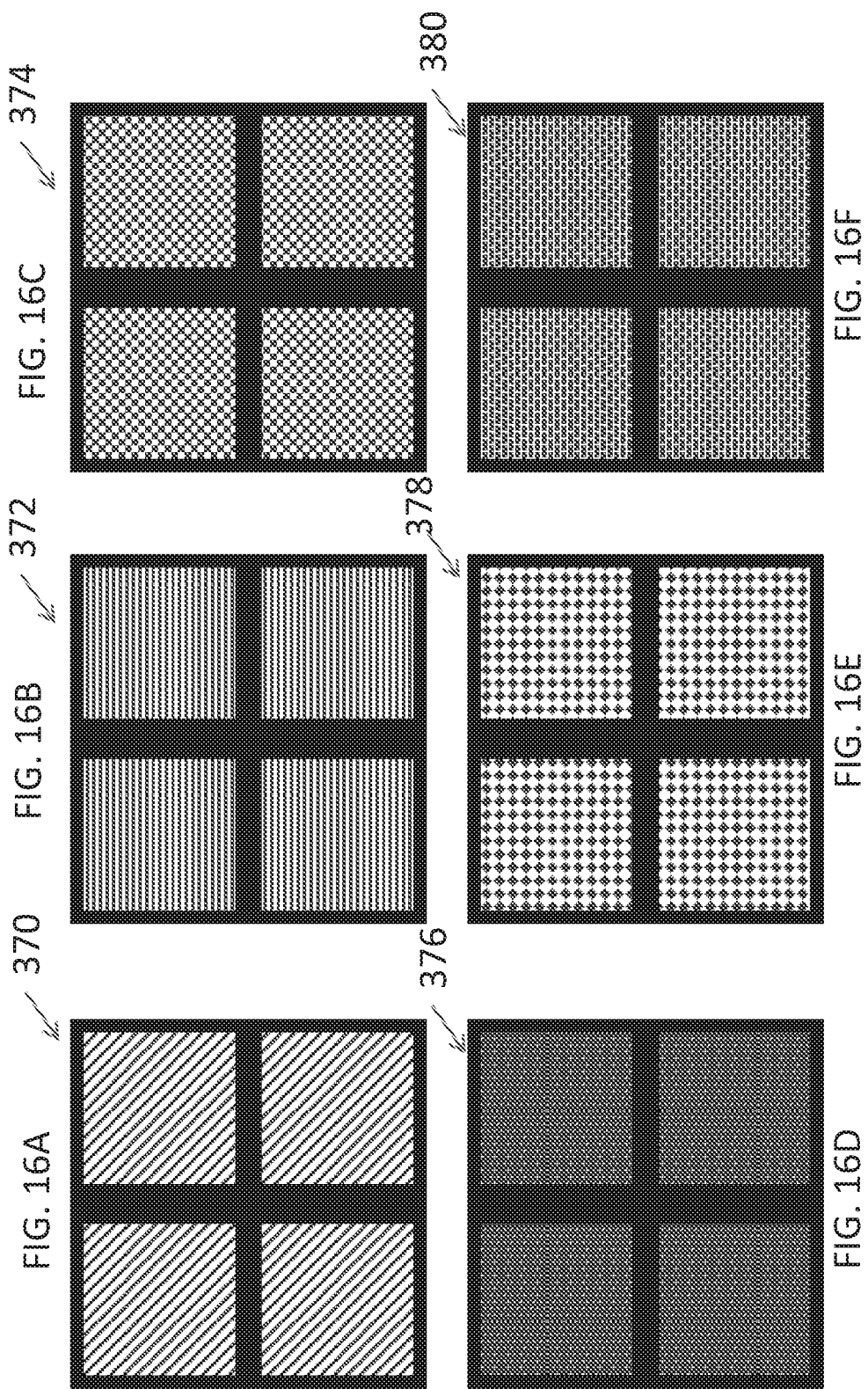

LITHOGRAPHIC TARGETS FOR UNIFORMITY CONTROL

CROSS REFERENCE TO RELATED APPLICATIONS

This application is a national stage application of PCT/EP2011/062761, filed on Jul. 25, 2011, which claims priority to U.S. Provisional Application 61/367,660, filed Jul. 26, 2010. The above application is incorporated by reference in its entirety.

TECHNICAL FIELD

This subject matter is generally related to lithographic targets for uniformity control.

BACKGROUND

Integrated circuits can be fabricated on a semiconductor wafer using a photolithography process. As features sizes of the integrated circuits become smaller, it is important to control the uniformity of the critical dimensions of resist features on the wafer. The critical dimensions refer to the dimensions of critical features on the wafer, such as minimum line width of single lines, minimum line width of densely spaced lines, and the minimum size of contact holes. The critical dimension uniformity greatly affects the yield and performance of integrated circuits produced from each wafer. The critical dimensions on the wafer can be measured using, for example, scanning electron microscopy. When non-uniformity in the critical dimensions within the image field on the wafer is detected, the photolithography system can be adjusted to reduce the non-uniformity to improve the quality of the integrated circuits fabricated on the wafer. The quality of integrated circuits can also be improved by reducing registration and overlay errors. Registration errors occur when features on a mask are offset from their intended positions. Overlay errors occur when features from two or more masks that are designed to be aligned with each other are not properly aligned during the lithography process.

SUMMARY

In general, in one aspect, a method for determining the critical dimension distribution of a photo mask is provided. The method includes providing a first photo mask having a first set of patterns and a second set of patterns, the first set of patterns corresponding to a circuit pattern to be fabricated on a wafer, the second set of patterns having dimensions such that the second set of patterns do not contribute to the circuit pattern that is produced using a lithography process based on the first set of patterns under a first exposure condition; and determining critical dimension distribution of the first photo mask based on the second set of patterns that do not contribute to the circuit pattern produced using the lithography process based on the first set of patterns under the first exposure condition.

Implementations of the method may include one or more of the following features. The first photo mask can be part of a set of photo masks used to fabricate a circuit on the wafer, and at least some of the patterns in the second set of patterns can be located at positions that correspond to circuit components. Determining critical dimension distribution of the first photo mask based on the second set of patterns can include projecting the second set of patterns onto a detector under a second exposure condition that is different from the first exposure condition, and analyzing images detected by the detector. The first exposure condition can specify a first range of exposure dose, the second exposure condition can specify a second range of exposure dose, and the second range can be outside of the first range. Determining critical dimension distribution of the first photo mask based on the second set of patterns can include projecting the second set of patterns onto a photoresist layer under a second exposure condition that is different from the first exposure condition, and analyzing the patterns on the photoresist layer. The first set of patterns can include opaque lines having a first minimum width, and the second set of patterns can include opaque lines having a second width that is less than the first minimum width. The second set of patterns can include groups of opaque lines, each group having patterns that are identical to other groups, the groups being distributed across the first photo mask in open spaces defined by the first set of patterns. The first set of patterns can include a first arrangement of contact openings, the second set of patterns can include a second arrangement of openings, and each opening in the second arrangement of openings can be smaller than a corresponding opening in the first arrangement of contact openings. The first arrangement of contact openings can include a first chain of contact openings, the second arrangement of openings can include a second chain of openings, and each opening in the second chain of openings can be smaller than a corresponding opening in the first chain of contact openings. The first set of patterns can include line openings having a first minimum width, and the second set of patterns can include line openings having a second width that is less than the first minimum width. The first set of patterns can include a first arrangement of features that correspond to contact openings, the second set of patterns can include a second arrangement of features, and each feature in the second arrangement of features can be smaller than a corresponding feature in the first arrangement of features. The first set of patterns can include a third pattern, and the second set of patterns can include a fourth pattern that has a same shape as the third pattern but rotated at a first angle relative to the third pattern. Determining critical dimension distribution of the first photo mask based on the second set of patterns can include projecting the second set of patterns onto a detector or a photoresist layer under a second exposure condition, the first exposure condition can include using an asymmetrical illumination in which an illumination source for the asymmetrical illumination has a first orientation relative to a lithography scanner, and the second exposure condition can include using the illumination source rotated to the first angle relative to the orientation of the illumination source in the first exposure condition, the asymmetrical illumination providing lighting that changes when the asymmetrical illumination is rotated relative to the scanner. The asymmetric illumination can include, e.g., a dipole illumination, a quadrupole illumination, or a hexapole illumination. The fourth pattern can be rotated 90 degrees relative to the first pattern.

The method can include applying optical proximity correction to the second set of patterns. Applying optical proximity correction can include applying optical proximity correction to the second set of patterns prior to incorporating the second set of patterns in the first photo mask. The method can include applying optical proximity correction to the first set of patterns prior to applying optical proximity correction to the second set of patterns. A target critical dimension of the optical proximity correction can be a target size of the second set of patterns. The optical proximity correction can be performed based on aerial image measurements or resist feature measurements. The method can include improving a process for manufacturing the first photo mask using information about the critical dimension distribution of the first photo mask determined based on the second set of patterns. The photo mask can include an optically transmissive mask or a reflective mask. The method can include irradiating the photo mask with a radiation having a wavelength in a range between 0.1 nm to 700 nm when printing the first set of patterns. The radiation can have a wavelength in a range between 1 nm to 10 nm.

In general, in another aspect, a method of determining placement errors is provided. The method includes providing a first photo mask having a first pattern and a second pattern, the first pattern corresponding to a circuit pattern to be fabricated on a wafer, the second pattern having dimensions such that the second pattern does not contribute to the circuit pattern that is produced using a lithography process based on the first pattern under a first exposure dose; and measuring exposure system aware mask registration using the second pattern under a second exposure dose different from the first exposure dose to determine both displacement errors of features on the first photo mask and exposure tool induced displacement errors.

Implementations of the method may include one or more of the following features. The second pattern can include an overall cross-shape pattern having a first sub-pattern extending along a first direction and a second sub-pattern extending along a second direction, the first bar intersecting the second bar, and the first sub-pattern can have a plurality of segments. The second pattern can include an overall cross-shape pattern having a first bar extending along a first direction and a second bar extending along a second direction, the first bar intersecting the second bar, and the first bar can include a plurality of parallel lines each having a length comparable to the length of the first bar and a width smaller than the width of the first bar. The second pattern can include a registration mark and a third pattern adjacent to the registration mark, the third pattern having a plurality of regularly spaced components that enables measurement of the exposure tool induced displacement errors. The second pattern can include a cross-shaped registration mark and patterns having a plurality of regularly spaced components at upper-left, upper-right, lower-left, and lower-right quarter surroundings of the cross-shaped registration mark to enable measurement of the exposure tool induced displacement errors. The cross-shaped registration mark can include an opaque cross-shaped pattern. The cross-shaped registration mark can include a cross-shaped spacing defined by the patterns having the plurality of regularly spaced components at upper-left, upper-right, lower-left, and lower-right quarter surroundings. Measuring exposure system aware mask registration using the second pattern under a second exposure dose can include printing the second pattern on a wafer under the second exposure dose. The first photo mask can include an optically transmissive mask or a reflective mask. The method can include irradiating the first photo mask with a radiation having a wavelength in a range between 0.1 nm to 700 nm when printing the first set of patterns. The radiation can have a wavelength in a range between 1 nm to 10 nm.

In general, in another aspect, a method for determining overlay error is provided. The method includes providing a first photo mask having a first pattern and a second pattern, the first pattern corresponding to a first circuit pattern to be fabricated on a wafer, the second pattern having dimensions such that the second pattern does not contribute to the first circuit pattern that is produced using a lithography process based on the first pattern under a first exposure condition; providing a second photo mask having a third pattern and a fourth pattern, the third patterns corresponding to a second circuit pattern to be fabricated on the wafer, the fourth pattern having dimensions such that the fourth pattern does not contribute to the second circuit pattern that is produced using a lithography process based on the third patterns under a third exposure condition; printing the second pattern on a photoresist layer under a second exposure condition; printing the fourth pattern on the photoresist layer under a fourth exposure condition; and determining overlay error between the second and fourth patterns printed on the photoresist layer.

Implementations of the method may include one or more of the following features. Each of the second and fourth patterns can include a registration target that can be recognized by a registration measurement tool. The second pattern can include a registration target that can be used to determine a displacement error of a feature on the first photo mask. The fourth pattern can include a registration target that can be used to determine a displacement error of a feature on the second photo mask. The first photo mask can include an optically transmissive mask. The first photo mask can include a reflective mask. The method can include irradiating the first photo mask with a radiation having a wavelength in a range between 0.1 nm to 700 nm when printing the first circuit pattern. The radiation can have a wavelength in a range between 1 nm to 10 nm.

In general, in another aspect, a method for determining overlay error is provided. The method includes providing a first photo mask having a first pattern and a second pattern, the first pattern corresponding to a first circuit pattern to be fabricated on a wafer, the second pattern having dimensions such that the second pattern does not contribute to the first circuit pattern that is produced using a lithography process based on the first pattern under a first exposure condition; providing a second photo mask having a third pattern and a fourth pattern, the third patterns corresponding to a second circuit pattern to be fabricated on the wafer, the fourth pattern having dimensions such that the fourth pattern does not contribute to the second circuit pattern that is produced using a lithography process based on the third pattern under a third exposure condition, the first and second circuit patterns being associated with an overall circuit pattern; printing the second pattern on a first wafer under a second exposure condition; printing the fourth pattern on a second wafer under a fourth exposure condition; measuring registration of the second pattern on the first wafer; measuring registration of the fourth pattern on the second wafer; and determining an overlay error between the second and fourth patterns based on the measurements of the wafer registration of the second pattern and the wafer registration of the fourth pattern.

Implementations of the method may include one or more of the following features. Each of the second and fourth patterns can include a registration target that can be recognized by a registration measurement tool. The second pattern can include a registration target that can be used to determine a displacement error of a feature on the first photo mask. The fourth pattern can include a registration target that can be used to determine a displacement error of a feature on the second photo mask. Measuring registration of the second pattern can include using a registration measurement tool in a reflective mode to measure registration of the second pattern. The first photo mask can include an optically transmissive mask or a reflective mask. The method can include irradiating the first photo mask with a radiation having a wavelength in a range between 0.1 nm to 700 nm when printing the first set of patterns. The radiation can have a wavelength in a range between 1 nm to 10 nm.

In general, in another aspect, an apparatus includes a first photo mask having a first set of patterns and a second set of patterns, the first set of patterns corresponding to a circuit pattern to be fabricated on a wafer using a lithography process having a first exposure condition, the second set of patterns having dimensions such that the second set of patterns do not contribute to the circuit pattern that is produced under the first exposure condition, the patterns of the second set of patterns being distributed at several locations across the first photo mask to enable determination of critical dimension distribution of the first photo mask.

Implementations of the apparatus may include one or more of the following features. The first photo mask can be part of a set of photo masks used to fabricate a circuit on the wafer, and at least some of the patterns in the second set of patterns can be located at positions that correspond to circuit components. The first set of patterns can include opaque lines having a first minimum width, and the second set of patterns can include opaque lines having a second width that is less than the first minimum width. The second set of patterns can include groups of opaque lines, each group having patterns that are identical to other groups, the groups being distributed across the first photo mask in open spaces defined by the first set of patterns. The first set of patterns can include a first arrangement of contact openings, the second set of patterns can include a second arrangement of openings, and each opening in the second arrangement of openings can be smaller than a corresponding opening in the first arrangement of openings. The first arrangement of contact openings can include a first chain of contact openings, the second arrangement of openings can include a second chain of openings, and each opening in the second chain of openings can be smaller than a corresponding opening in the first chain of contact openings. The first set of patterns can include line openings having a first minimum width, and the second set of patterns can include line openings having a second width that is less than the first minimum width. The first set of patterns can include a first arrangement of opaque lines, the second set of patterns can include a second arrangement of opaque lines, and each line in the second arrangement can have a width smaller than the width of a corresponding line in the first arrangement.

The first set of patterns can include a third pattern, and the second set of patterns can include a fourth pattern that has a same shape as the third pattern but rotated at a first angle relative to the third pattern. Determining critical dimension distribution of the first photo mask based on the second set of patterns can include projecting the second set of patterns onto a detector or a photoresist layer under a second exposure condition, the first exposure condition can include using an asymmetrical illumination in which an illumination source for the asymmetrical illumination has a first orientation relative to a lithography scanner, and the second exposure condition can include using the illumination source rotated to the first angle relative to the orientation of the illumination source in the first exposure condition, the asymmetrical illumination providing lighting that changes when the asymmetrical illumination is rotated relative to the scanner. The asymmetric illumination can include, e.g., a dipole illumination, a quadrupole illumination, or a hexapole illumination. The fourth pattern can be rotated 90 degrees relative to the first pattern. The first photo mask can include an optically transmissive mask or a reflective mask. The first photo mask can be irradiated with a radiation having a wavelength in a range between 0.1 nm to 700 nm when printing the first circuit pattern. The radiation can have a wavelength in a range between 1 nm to 10 nm.

In general, in another aspect, a system includes a lithography scanner that can provide a plurality of exposure conditions; an imaging tool to measure a transmission profile across a photo mask having a first set of patterns and a second set of patterns, the first set of patterns corresponding to a circuit pattern to be fabricated on a wafer using a first exposure condition, the second set of patterns having dimensions such that the second set of patterns do not contribute to the circuit pattern that is produced under the first exposure condition; and a computing system to control the scanner to provide light for illuminating the photo mask, control the imaging tool to detect a projected image of the second set of patterns, determine critical dimension distribution of the photo mask based on the image of the second set of patterns detected by the imaging tool, and control the scanner to provide light for illuminating the photo mask under the first exposure condition and project the first set of patterns to a photoresist layer on a wafer.

Implementations of the system may include one or more of the following features. The system can include a mask correction tool, and the computing system can be configured to control the mask correction tool to correct the photo mask according to the critical dimension distribution of the photo mask to improve uniformity of critical dimension distribution on the wafer.

In general, in another aspect, a system includes a lithography scanner that can provide a plurality of exposure conditions; a mask stage to support a photo mask having a first set of patterns and a second set of patterns, the first set of patterns corresponding to a circuit pattern to be fabricated on a wafer using a first exposure condition, the second set of patterns having dimensions such that the second set of patterns do not contribute to the circuit pattern that is produced under the first exposure condition; a wafer stage to support a wafer; a wafer critical dimension measurement tool; and a computing system to control the scanner to provide light for illuminating the photo mask under a second exposure condition and image the second set of patterns onto a first photoresist layer on a wafer, control the wafer critical dimension measurement tool to measure the second set of patterns, determine critical dimension distribution of the wafer based on the second set of patterns measured by the wafer critical dimension measurement tool, and control the scanner to provide light for illuminating the photo mask under the first exposure condition and image the first set of patterns onto a second photoresist layer on the wafer.

Implementations of the system may include one or more of the following features. The system can include a mask correction tool, and the computing system can be configured to control the mask correction tool to correct the photo mask according to the critical dimension distribution of the wafer to improve uniformity of critical dimension distribution on the wafer. The photo mask can include an optically transmissive mask or a reflective mask. The photo mask can be irradiated with a radiation having a wavelength in a range between 0.1 nm to 700 nm when printing the first circuit pattern. The radiation can have a wavelength in a range between 1 nm to 10 nm.

In general, in another aspect, a method for improving a performance of features generated on a carrier plate is provided. The method includes providing a plurality of ghost pattern targets on a carrier plate, each ghost pattern target being useful for characterizing a measurand for evaluating a feature on the carrier plate; measuring the measurand across the carrier plate by measuring parameters of the ghost pattern targets; determining a mean value of the measurand and deviations from the mean value across the carrier plate; and applying a corrective measure to the carrier plate to reduce the deviations of the measurand from the mean value across the carrier plate.

Implementations of the method may include one or more of the following features. The carrier plate can include a photo mask having the features and the ghost pattern targets, the features corresponding to a circuit pattern to be fabricated on a wafer, the ghost pattern targets having dimensions such that the ghost pattern targets do not contribute to the circuit pattern that is produced using a lithography process based on the features under a first exposure condition. Applying a corrective measure to the carrier plate can include changing a transmittance at a region of the carrier plate. Applying a corrective measure to the carrier plate can include determining a pixel writing density needed to reduce the deviation of the measurand from the mean value, and writing pixels in the carrier plate according to the pixel writing density.

The method can include, after applying the corrective measure, repeating determining the mean value and the deviations, and applying the corrective measure to reduce the deviations until a predetermined quality standard is satisfied. The carrier plate can include a photo mask. The method can include, after applying the corrective measure to the photo mask, using the photo mask to print circuit patterns on a wafer. The method can include improving uniformity of critical dimension of the circuit patterns printed on the wafer as a result of applying the corrective measure. The carrier plate can include a body that is transparent with respect to a radiation used in a lithography process, and the features on the carrier plate can include thin radiation absorbing or semi-absorbing lamellas having information for manufacturing an integrated device using the lithography process. The measurand can include a one-dimensional (1D) or two-dimensional (2D) lateral dimension of the feature. The ghost pattern targets do not print as resist features at nominal exposure conditions in a lithographic process for printing circuit patterns. The ghost pattern targets do not print at an exposure dose that deviates from the nominal exposure dose by a predetermined amount. The predetermined amount of deviation from the nominal exposure dose can include three standard deviations from the nominal exposure dose plus a safety margin. The safety margin can include 10% of the nominal dose plus three standard deviations. The safety margin can depend on a stability of a lithography process. The carrier plate can include an optically transmissive mask or a reflective mask. The method can include irradiating the mask with a radiation having a wavelength in a range between 0.1 nm to 700 nm when printing active features on the mask. The radiation can have a wavelength in a range between 1 nm to 10 nm.

In general, in another aspect, a method for improving a performance of features generated on a carrier plate is provided. The method includes providing a plurality of ghost pattern targets that each can be used for characterizing a measurand indicative of a performance of a feature on the carrier plate; printing the ghost pattern targets on a wafer using an exposure dose that is different from a nominal dose used to print circuit patterns; measuring the measurand across the wafer by measuring parameters of printed ghost pattern targets on the wafer; determining deviations of the measured values of the measurand from intended values of the measurand; and
applying a corrective measure to the carrier plate to reduce the deviations.

Implementations of the method may include one or more of the following features. The measurand can include a position of a center of gravity of a feature. The method can include improving placement precision of the feature by reducing the deviations. The carrier plate can include an optically transmissive mask or a reflective mask. The method can include irradiating the mask with a radiation having a wavelength in a range between 0.1 nm to 700 nm when printing active features on the mask. The radiation can have a wavelength in a range between 1 nm to 10 nm.

In general, in another aspect, a method for improving overlay accuracy of features generated on two or more carrier plates is provided. The method includes providing a plurality of ghost pattern targets on a first carrier plate and a second carrier plate, the ghost pattern targets being useful for characterizing accuracy of overlay of features on the first and second carrier plates; printing the ghost pattern targets from the first carrier plate onto a wafer using a first exposure dose that is different from a nominal dose used to print circuit patterns; printing the ghost pattern targets from the second carrier plate onto the wafer using the first exposure dose; measuring overlay errors across the wafer by measuring parameters of printed ghost pattern targets; and applying a corrective measure to at least one of the first or second carrier plates to reduce the overlay errors.

Implementations of the method may include one or more of the following features. The overlay error can include a deviation of a first printed ghost pattern target from a second printed ghost pattern target, the first printed ghost pattern target being transferred from the first carrier plate, and the second printed ghost pattern target being transferred from the second carrier plate. The carrier plates can include optically transmissive masks or reflective masks. The method can include irradiating the first mask with a radiation having a wavelength in a range between 0.1 nm to 700 nm when printing active features on the first mask. The radiation can have a wavelength in a range between 1 nm to 10 nm.

In general, in another aspect, a method for improving a performance of features generated on a photo mask is provided. The method includes providing a plurality of ghost pattern targets across a photo mask, each ghost pattern target being useful for characterizing a measurand for evaluating a feature to be transferred from the photo mask onto a wafer using a nominal dose of exposure; printing the ghost pattern targets onto the wafer using a first exposure dose different from the nominal exposure dose; measuring the printed ghost pattern targets across the wafer to determine a distribution of the measurand across the wafer; determining a mean value of the measurand and deviations from the mean value across the carrier plate; and applying a corrective measure to the photo mask to reduce the deviations of the measurand from the mean value across the wafer.

Implementations of the method may include one or more of the following features. The photo mask has the features and the ghost pattern targets, the features corresponding to a circuit pattern to be fabricated on a wafer, the ghost pattern targets having dimensions such that the ghost pattern targets do not contribute to the circuit pattern that is produced using a lithography process based on the features under a first exposure condition. Applying a corrective measure to the photo mask can include changing a transmittance at a region of the photo mask. The photo mask can include an optically transmissive mask or a reflective mask. The method can include irradiating the mask with a radiation having a wavelength in a range between 0.1 nm to 700 nm when printing active features on the mask. The radiation can have a wavelength in a range between 1 nm to 10 nm.

In general, in another aspect, a method for improving intra-field critical dimension (CD) uniformity of a projection system for performing lithographic processes for manufacturing integrated devices is provided. The method includes providing a plurality of ghost pattern targets (GPTs) in a layout of a product mask; measuring the critical dimension of the ghost pattern target at the mask; determining a mean critical dimension value and deviations from this mean value across the mask $\Delta CD_{Mask}(x, y)$; determining mask contribution to wafer infra-field critical dimension variation by applying a formula $\Delta CD_{wafer-M}(x, y)=0.25*MEEF*\Delta CD_{Mask}(x, y)$; determining relative intensity variation within the scanner slit $\Delta I_{rel-Slit-I}(x)$; determining slope of CD-versus-relative dose curve $(\Delta CD/\Delta D)$; determining scanner contribution to the wafer intra-field critical dimension variation according to a formula $\Delta CD_{slit}(x)=(\Delta CD/\Delta D)*\Delta I_{rel-Slit}(x)$; determining a total wafer intra-field critical dimension variation according to a formula $\Delta CD_{wafer-total}(x, y)=\Delta CD_{Wafer-M}(x, y)+\Delta CD_{Slit-I}(x)$; determining transmission variations across the mask blank $T(x, y)$ that are needed to correct for wafer intra-field critical dimension variation; applying a corrective measure to the mask blank according to the transmission variation $T(x, y)$; and printing transmission corrected product mask by applying a nominal dose to transfer active product features to a wafer.

Implementations of the method may include one or more of the following features. A geometrical arrangement of the ghost pattern targets can correspond to an arrangement of elements of lithographical critical active feature of the layout. Pitches of elements of the ghost pattern target can correspond to pitches of lithographical critical active features of the layout. Elements of the ghost pattern target can have a reduced size compared to corresponding active product mask features. The size reduction can be chosen such that the ghost pattern targets will not print as resist features at nominal exposure. A symmetry axis of an arrangement of ghost pattern target elements can correspond to a symmetry axis of elements of a corresponding active feature. A symmetry axis of an arrangement of ghost pattern target elements can be rotated relative to a symmetry axis of elements of a corresponding active feature. The symmetry axis of the arrangement of the ghost pattern target elements can be rotation 90° relative to the symmetry axis of the elements of the corresponding active feature. In some examples, dark ghost pattern targets can be implemented in light regions of active feature patterns on the mask. In some examples, bright ghost pattern targets can be implemented in dark regions of active feature patterns of the mask. Bright ghost pattern targets can be implemented within dark active features having a size sufficient to accommodate the bright ghost pattern targets. More than one type of ghost pattern targets can be implemented in the mask layout. Light and dark ghost pattern targets can both be implemented in the mask layout. Ghost pattern targets and active printing features can be used for input data determination. At least one type of ghost pattern targets can include, e.g., an isolated dark line, an isolated light space, an isolated contact hole, or an isolated dark pillar. The ghost pattern targets can include, e.g., dark lines, bright spaces, contacts, pillars, or a combination of the above. The mask can include a mask absorber. The mask absorber can include chromium. The mask absorber can include a semi-transparent material that induces a phase-shift substantially equal to 180° in light passing through the absorber. The mask absorber can include MoSi. The critical dimension can be measured using a secondary electron beam microscope. The critical dimension can be measured based on scatterometry. The critical dimension can be measured based on optical aerial imaging. Measuring the critical dimension can include using an illumination source that is also used for scanner mask projection. Measuring the critical dimension can include measuring a first parameter, then converting the first parameter values to critical dimension values. Measuring the critical dimension can include measuring transmission of the mask and converting the transmission values to the critical dimension values according to a predetermined relationship between the transmission and the critical dimension. The method can include correcting the determined mask contribution to the wafer intra-field critical dimension variation by a factor characterized by a relationship between mask error enhancement factor (MEEF) values of resist features and aerial image. The method can include correcting the determined mask critical dimension variation by a factor representing a relationship between critical dimension variations of active features and the ghost pattern targets. The method can include correcting the determined variation of the intra-slit intensity by a factor dependent on a strength of intra-field and inter-field flare during mask projection. The method can include, for non-conformal ghost pattern target elements, correcting the determined critical dimension variation by a factor dependent on a relationship between MEEF values of active features and the ghost pattern targets.

In general, in another aspect, a method of implementing lithography targets for uniformity control in a photo mask is provided. The method includes defining outer dimensions of ghost pattern targets; identifying un-patterned areas in a photo mask layout having circuit patterns, the un-patterned areas being free of the circuit patterns and sufficiently large to accommodate one or more ghost pattern targets; identifying locations in the un-patterned areas for placement of the ghost pattern targets, taking into account the outer dimensions of ghost pattern targets; and implementing the ghost pattern targets in the photo mask layout at the identified locations.

Implementations of the method may include one or more of the following features. The ghost pattern targets do not print under a nominal exposure dose used to print the circuit patterns. The method can include defining distances between the ghost pattern targets, in which identifying locations in the un-patterned areas for placement of the ghost pattern targets takes into account the distances between two or more ghost pattern targets. The method can include defining distances between the ghost pattern targets and circuit patterns, in which identifying locations in the un-patterned areas for placement of the ghost pattern targets takes into account the distances between the ghost pattern targets and the circuit patterns. The method can include placing the ghost pattern targets homogeneously across the photo mask. In some examples, a symmetry axis of an arrangement of ghost pattern target elements can correspond to a symmetry axis of elements of a corresponding circuit pattern. In some examples, a symmetry axis of an arrangement of ghost pattern target elements can be rotated relative to a symmetry axis of elements of a corresponding circuit pattern. The method can include identifying locations in the un-patterned areas for placement of the ghost pattern after finalizing the circuit patterns. The method can include applying optical proximity correction to the circuit patterns, in which identifying locations in the un-patterned areas for placement of the ghost pattern can be performed after applying optical proximity correction to the circuit patterns. The method can include applying optical proximity correction to elements of the ghost pattern targets after applying optical proximity correction to the circuit patterns. The method can include applying optical proximity correction to elements of the ghost pattern targets. The method can include implementing two or more types of ghost pattern targets in the photo mask layout. Different types of ghost pattern targets can have different micro structures. Different types of ghost pattern targets can have different macroscopic dimensions. The photo mask can include an optically transmissive mask or a reflective mask. The method can include irradiating the photo mask with a radiation having a wavelength in a range between 0.1 nm to 700 nm when printing the first set of patterns. The radiation can have a wavelength in a range between 1 nm to 10 nm.

In general, in another aspect, a method for improving intra-field critical dimension uniformity of a projection system for performing lithographic processes for manufacturing integrated devices using mask blank transmission control is provided. The method includes providing one or more ghost pattern targets in a layout of a product mask; printing the ghost pattern targets in a photoresist using a dose different from a nominal exposure dose for printing active product features; measuring critical dimensions of the ghost pattern targets across an image field; determining a mean critical dimension and deviations of local critical dimensions from the mean critical dimension; applying critical dimension correction to the product mask by adjusting transmission of various regions across the product mask to reduce the deviations of local critical dimensions relative to the mean critical dimension; and applying the nominal exposure dose to the transmission corrected product mask to print the active product features.

Implementations of the method may include one or more of the following features. A geometrical arrangement of the ghost pattern targets can correspond to an arrangement of elements of lithographical critical active feature of the layout. Pitches of elements of the ghost pattern targets can correspond to pitches of lithographical critical active features of the layout. Elements of the ghost pattern targets can have a reduced size compared to corresponding active product mask features. The reduction can be chosen such that the ghost pattern targets will not print as resist features at nominal exposure. A symmetry axis of an arrangement of ghost pattern targets elements can correspond to a symmetry axis of elements of a corresponding active feature. A symmetry axis of an arrangement of ghost pattern target elements can be rotated relative to a symmetry axis of elements of a corresponding active feature. The symmetry axis of the arrangement of the ghost pattern target elements can be rotation 90° relative to the symmetry axis of the elements of the corresponding active feature. In some examples, dark ghost pattern targets can be implemented in light regions of active feature patterns on the mask. In some examples, bright ghost pattern targets can be implemented in dark regions of active feature patterns of the mask. Bright ghost pattern targets can be implemented within dark active features having a size sufficient to accommodate the bright ghost pattern targets. More than one type of ghost pattern targets can be implemented in the mask layout. Light and dark ghost pattern targets can both be implemented in the mask layout. Ghost pattern targets and active printing features can be used for input data determination. At least one type of ghost pattern targets can include, e.g., an isolated dark line, an isolated light space, an isolated contact hole, or an isolated dark pillar. The ghost pattern targets can include, e.g., dark lines, bright spaces, contacts, pillars, or a combination of the above. The mask can include a mask absorber. The mask absorber can include chromium. The mask absorber can include a semi-transparent material that induces a phase-shift substantially equal to 180° in light passing through the absorber. The mask absorber can include MoSi.

In general, in another aspect, a method for using ghost pattern targets to improve registration of a photo mask for use in manufacturing integrated devices using pixel writing techniques for lateral dimension change of the mask blank is provided. The method includes implementing registration ghost pattern targets into a layout of a product mask, the registration ghost pattern targets having dimensions such that the registration ghost pattern targets do not print under a nominal exposure dose used to print active features on the product mask; measuring positions of the registration ghost pattern targets across the mask; determining registration errors based on the measured positions; and writing pixels to various regions of the product mask to correct the registration errors.

Implementations of the method may include one or more of the following features. Writing a pixel can include focusing a laser beam at a region inside a body of the product mask to change an optical property of the region. A transmittance of a region can be reduced after formation of a pixel at the region. The method can include repeating measuring the positions of the registration ghost pattern targets, determining registration errors based on the measured positions, and writing pixels until a quality criterion for registration accuracy is met. A geometrical arrangement of the ghost pattern target elements can correspond to an arrangement of elements of lithographical critical active features of a mask layout. Pitches of the elements of the ghost pattern target in x and y directions can correspond to pitches of the lithographical critical active feature of the layout in the x and y directions, respectively. Elements of the ghost pattern target can have a reduced size compared to corresponding active product mask features. The size reduction can be chosen such that the registration ghost pattern targets do not print as resist features at the nominal exposure. A symmetry axis of an arrangement of the ghost pattern target elements can correspond to a symmetry axis of elements of the active feature. A symmetry axis of an arrangement of the ghost pattern target elements can be rotated relative to an axis of elements of the active feature. The rotation can be, e.g., 90°. In some examples, dark ghost pattern targets can be implemented in bright regions of the mask design. In some examples, bright ghost pattern targets can be implemented in dark regions of the mask design. Bright ghost pattern targets can be implemented into dark active features of sufficient size. Two or more types of ghost pattern targets can be implemented in the mask layout. Light and dark types of ghost pattern targets can be implemented in the mask layout. Ghost pattern targets and active printing features can be used for determining input data for mask writing. At least one type of ghost pattern target can include, e.g., an isolated dark line, an isolated light space, an isolated contact hole, or an isolated dark pillar. The ghost pattern target can include, e.g., dark lines, bright spaces, contacts, or pillars, or combinations of the above. The mask can include light absorbing material. The light absorbing material can include chromium. Measuring positions of the registration ghost pattern targets can include using a measurement tool that does not resolve a lateral geometry of the ghost pattern target elements. Measuring positions of the registration ghost pattern targets can include using a measurement tool that determines edges of macroscopic images of the ghost pattern targets without resolving details within the ghost pattern targets. The product mask can include an optically transmissive mask or a reflective mask. The method can include irradiating the product mask with a radiation having a wavelength in a range between 0.1 nm to 700 nm when printing the first set of patterns. The radiation can have a wavelength in a range between 1 nm to 10 nm.

In general, in another aspect, a method of using registration ghost pattern targets for reducing pattern placement errors of printed mask features within an image field is provided. The method includes implementing multiple registration ghost pattern targets in a layout of a product mask, the registration ghost pattern targets having dimensions such that the registration ghost pattern targets do not print under a nominal exposure dose used to print active features on the product mask; printing the registration ghost pattern targets as photo resist features on a wafer using an exposure dose different from the nominal dose; measuring positions of the resist features of the registration ghost pattern targets across an image field; determining registration errors based on the measured positions; and applying correction measures to the product mask to correct the registration errors.

Implementations of the method may include one or more of the following features. Applying correction measures can include focusing a laser beam at regions inside a body of the product mask to change a physical property of the regions. A density of a region can be modified after using the laser beam to write a pixel at the region to cause localized contraction or expansion. The method can include repeating printing the registration ghost pattern targets as photo resist features, measuring the positions of the registration ghost pattern targets, determining registration errors based on the measured positions, and writing pixels to the mask to compensate for the registration errors until a quality criterion for registration accuracy is met. A geometrical arrangement of the ghost pattern target elements can correspond to an arrangement of elements of lithographical critical active features of a mask layout. Pitches of the elements of the ghost pattern target in x and y directions can correspond to pitches of the lithographical critical active feature of the layout in the x and y directions, respectively. Elements of the ghost pattern target can have a reduced size compared to corresponding active product mask features. The size reduction can be chosen such that the registration ghost pattern targets do not print as resist features at the nominal exposure. A symmetry axis of an arrangement of the ghost pattern target elements can correspond to a symmetry axis of elements of the active feature. A symmetry axis of an arrangement of the ghost pattern target elements can be rotated relative to an axis of elements of the active feature. The rotation can be, e.g., 90°. In some examples, dark ghost pattern targets can be implemented in bright regions of the mask design. In some examples, bright ghost pattern targets can be implemented in dark regions of the mask design. Bright ghost pattern targets can be implemented into dark active features of sufficient size. Two or more types of ghost pattern targets can be implemented in the mask layout. Light and dark types of ghost pattern targets can be implemented in the mask layout. Ghost pattern targets and active printing features can be used for determining input data for mask writing. At least one type of ghost pattern target can include, e.g., an isolated dark line, an isolated light space, an isolated contact hole, or an isolated dark pillar. The ghost pattern target can include, e.g., dark lines, bright spaces, contacts, or pillars, or combinations of the above. The mask can include light absorbing material. The light absorbing material can include chromium. Measuring positions of the registration ghost pattern targets can include using a measurement tool that does not resolve a lateral geometry of the ghost pattern target elements. Measuring positions of the registration ghost pattern targets can include using a measurement tool that determines edges of macroscopic images of the ghost pattern targets without resolving details within the ghost pattern targets. The product mask can include an optically transmissive mask or a reflective mask. The method can include irradiating the product mask with a radiation having a wavelength in a range between 0.1 nm to 700 nm when printing the first set of patterns. The radiation can have a wavelength in a range between 1 nm to 10 nm.

In general, in another aspect, a method of using registration ghost pattern targets for reducing overlay errors of features of at least two masks is provided. The method includes implementing multiple registration ghost pattern targets in layouts of two product masks, the registration ghost pattern targets having dimensions such that the registration ghost pattern targets do not print under nominal exposure doses used to print active features on the product masks; printing the registration ghost pattern targets on the two product masks as features on a wafer using exposure doses different from the nominal doses; measuring relative position differences of corresponding printed registration ghost pattern targets across the an image field; determining overlay errors based on the measured positions; and applying correction measures to the product mask to correct the overlay errors.

Implementations of the method may include one or more of the following features. In some examples, the ghost pattern targets on the two masks can be printed into a same photo resist layer. In some examples, the ghost pattern targets on the two masks are not printed into a same photo resist layer. The ghost pattern targets on a first mask can be printed on a first material layer on the wafer, and the ghost pattern targets on a second mask can be printed on a second material layer on the wafer. The second material layer can include a photo resist layer. A geometrical arrangement of the ghost pattern target elements can correspond to an arrangement of elements of lithographical critical active features of a mask layout. Pitches of the elements of the ghost pattern target in x and y directions can correspond to pitches of the lithographical critical active feature of the layout in the x and y directions, respectively. Elements of the ghost pattern target can have a reduced size compared to corresponding active product mask features. The size reduction can be chosen such that the registration ghost pattern targets do not print as resist features at the nominal exposure. A symmetry axis of an arrangement of the ghost pattern target elements can correspond to a symmetry axis of elements of the active feature. A symmetry axis of an arrangement of the ghost pattern target elements can be rotated relative to an axis of elements of the active feature. The rotation can be, e.g., 90°. In some examples, dark ghost pattern targets can be implemented in bright regions of the mask design. In some examples, Bright ghost pattern targets can be implemented in dark regions of the mask design. Bright ghost pattern targets can be implemented into dark active features of sufficient size. Two or more types of ghost pattern targets can be implemented in the mask layout. Light and dark types of ghost pattern targets can be implemented in the mask layout. Ghost pattern targets and active printing features can be used for determining input data for mask writing. At least one type of ghost pattern target can include, e.g., an isolated dark line, an isolated light space, an isolated contact hole, or an isolated dark pillar. The ghost pattern target can include, e.g., dark lines, bright spaces, contacts, or pillars, or combinations of the above. The mask can include light absorbing material. The light absorbing material can include chromium. Measuring positions of the registration ghost pattern targets can include using a measurement tool having an illumination source distribution that corresponds to an illumination of a projection system used for wafer print. Measuring positions of the registration ghost pattern targets can include using a measurement tool that does not resolve a lateral geometry of the ghost pattern target elements. Measuring positions of the registration ghost pattern targets can include using a measurement tool that determines edges of macroscopic images of the ghost pattern targets without resolving details within the ghost pattern targets. The product masks can include optically transmissive masks or reflective masks. The method can include irradiating the first product mask with a radiation having a wavelength in a range between 0.1 nm to 700 nm when printing the first set of patterns. The radiation can have a wavelength in a range between 1 nm to 10 nm.

In general, in another aspect, a method of improving intra-field critical dimension uniformity of a projection system for performing of lithographic processes for manufacturing integrated devices is provided. The method includes providing ghost pattern targets in the layout of a product mask; printing the ghost pattern targets in a photo resist using an exposure dose that is different from a nominal dose used to print active mask features on the product mask; measuring critical dimensions of ghost pattern targets across an image field; determining a mean critical dimension and deviations of local critical dimension from the mean critical dimension; determining a dose correction matrix for the image field for correcting wafer intra-field critical dimension variation; and applying the dose correction matrix when exposing the product mask to print the active mask features.

Implementations of the method may include one or more of the following features. Determining a dose correction matrix can include determining a dose correction matrix for a Dose Mapper process or scanner. A geometrical arrangement of the ghost pattern targets can correspond to an arrangement of elements of lithographical critical active feature of the layout. Pitches of elements of the ghost pattern target can correspond to pitches of lithographical critical active features of the layout. Elements of the ghost pattern target can have a reduced size compared to corresponding active product mask features. The size reduction can be chosen such that the ghost pattern targets will not print as resist features at nominal exposure. A symmetry axis of an arrangement of ghost pattern target elements can correspond to a symmetry axis of elements of a corresponding active feature. A symmetry axis of an arrangement of ghost pattern target elements can be rotated relative to a symmetry axis of elements of a corresponding active feature. The symmetry axis of the arrangement of the ghost pattern target elements can be rotated, e.g., 90°, relative to the symmetry axis of the elements of the corresponding active feature. Dark ghost pattern targets can be implemented in light regions of active feature patterns on the mask. Bright ghost pattern targets can be implemented in dark regions of active feature patterns of the mask. Bright ghost pattern targets can be implemented within dark active features having a size sufficient to accommodate the bright ghost pattern targets. More than one type of ghost pattern targets can be implemented in the mask layout. Light and dark ghost pattern targets can both be implemented in the mask layout. Ghost pattern targets and active printing features can be used for input data determination. At least one type of ghost pattern targets can include, e.g., an isolated dark line, an isolated light space, an isolated contact hole, or an isolated dark pillar. The ghost pattern targets can include, e.g., dark lines, bright spaces, contacts, pillars, or a combination of the above. The mask can include a mask absorber. The mask absorber can include chromium. The mask absorber can include a semi-transparent material that induces a phase-shift substantially equal to 180° in light passing through the absorber. The mask absorber can include MoSi. The critical dimension can be measured using a secondary electron beam microscope. The critical dimension can be measured based on scatterometry. The method can include correcting the determined mask critical dimension variation by a factor representing a relationship between critical dimension variations of active features and the ghost pattern targets. The method can include correcting the determined variation of the intra-slit intensity by a factor dependent on a strength of intra-field and inter-field flare during mask projection. The method can include, for non-conformal ghost pattern target elements, correcting the determined critical dimension variation by a factor dependent on a relationship between MEEF values of active features and the ghost pattern targets. The product mask can include an optically transmissive mask or a reflective mask. The method can include irradiating the product mask with a radiation having a wavelength in a range between 0.1 nm to 700 nm when printing the first set of patterns. The radiation can have a wavelength in a range between 1 nm to 10 nm.

In general, in another aspect, a method of using ghost pattern targets for improving critical dimension uniformity when fabricating a photo mask is provided. The method includes implementing multiple ghost pattern targets into a layout of a first mask; measuring critical dimension of the ghost pattern targets on the first mask; determining critical dimension errors across the first mask based on the measured critical dimension; fabricating a second mask and applying a corrective measure based on the determined critical dimension errors across the first mask to improve critical dimension uniformity of the second mask.

Implementations of the method may include one or more of the following features. The method can include determining a dose correction matrix based on the determined critical dimension errors across the first mask, and using the dose correction matrix when fabricating the second mask to improve critical dimension uniformity. Fabricating the second mask can include using an e-beam or an optical pixel writing process to fabricate the second mask. The dose correction matrix can be used to control the e-beam or the optical pixel writing process. The first mask can include an optically transmissive mask or a reflective mask. The method can include irradiating the first mask with a radiation having a wavelength in a range between 0.1 nm to 700 nm when printing the first set of patterns. The radiation can have a wavelength in a range between 1 nm to 10 nm.

In general, in another aspect, a method for using ghost pattern targets to improve registration of a photo mask to be used for manufacturing integrated devices is provided. The method includes implementing multiple registration ghost pattern targets into a layout of a first mask; measuring lateral positions of the registration ghost pattern targets across the first mask; determining registration errors based on the measured lateral positions; fabricating a second mask and applying a corrective measure based on the determined registration errors across the first mask to improve registration in the second mask.

Implementations of the method may include one or more of the following features. The method can include determining a lateral position correction grid based on the determined registration errors across the first mask, and using the lateral position correction grid when fabricating the second mask to improve registration. Fabricating the second mask can include using an e-beam or an optical pixel writing process to fabricate the second mask. The lateral position correction grid can be used to control the e-beam or the optical pixel writing process. The first mask can include an optically transmissive mask or a reflective mask. The method can include irradiating the first mask with a radiation having a wavelength in a range between 0.1 nm to 700 nm when printing the first set of patterns. The radiation can have a wavelength in a range between 1 nm to 10 nm.

BRIEF DESCRIPTION OF DRAWINGS

FIG. 2 is a diagram of an example active product feature and a corresponding ghost pattern for a bright field mask.

FIG. 3 is a diagram of an example active product feature and a corresponding ghost pattern for a positive tone type mask.

FIG. 9 is a diagram of an example active product feature on a bright field photo mask.

FIGS. 14A to 14D and 15A to 15F are diagrams of example registration ghost pattern targets for bright field masks.

FIGS. 16A to 16F are diagrams of example registration ghost pattern targets for dark field masks.

DETAILED DESCRIPTION

Figure 1:
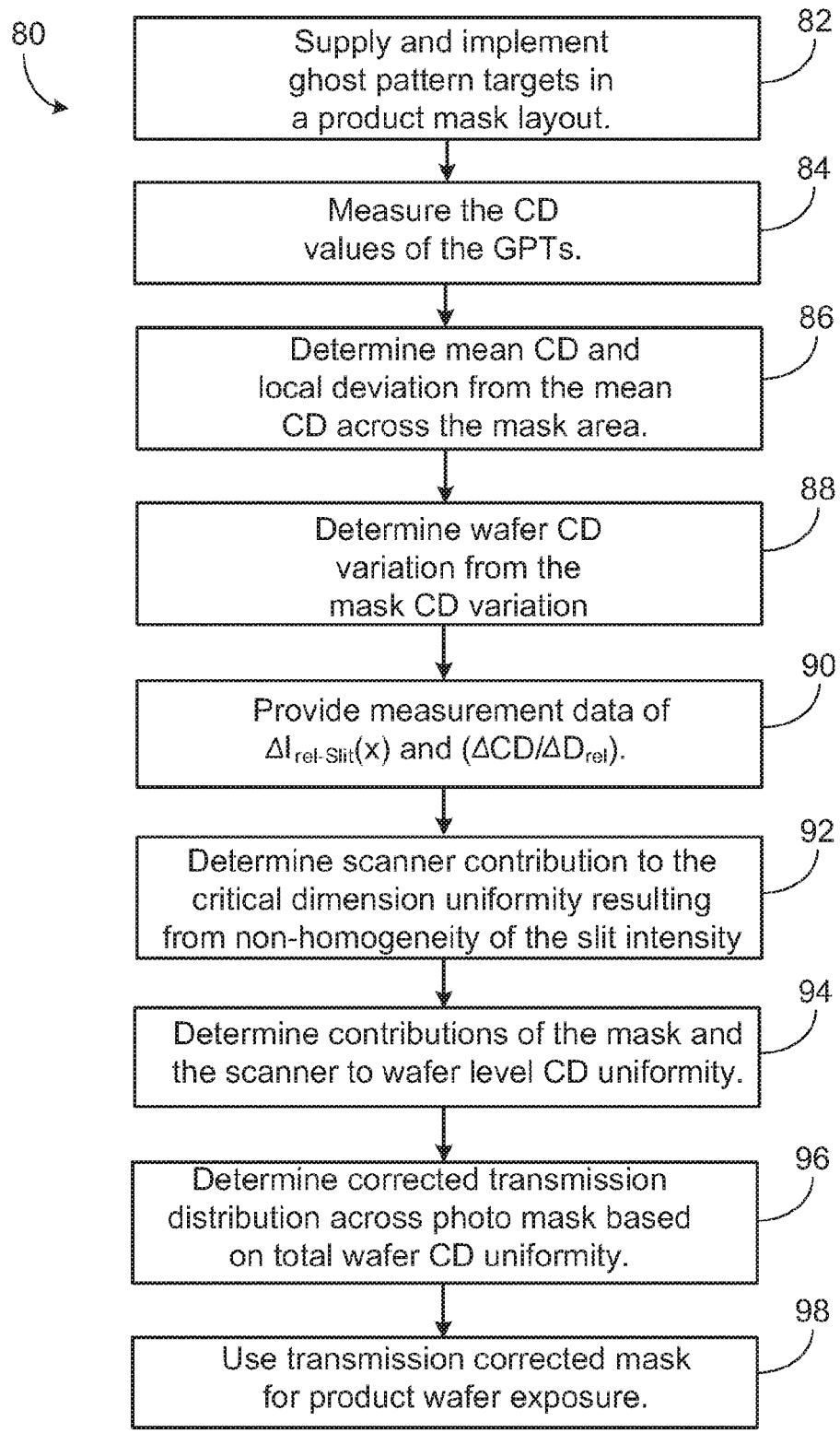
FIG. 1 is a flow diagram of an example work flow for using ghost patterns for improving critical dimension uniformity.

A system for improving the quality of a semiconductor lithography process is provided. For example, critical dimension uniformity, mask registration accuracy, and overlay accuracy can be improved. A circuit layer on a semiconductor wafer can be fabricated by using a scanner to project light through a photo mask (or reticle) to transfer a pattern on the photo mask to the wafer. The critical dimension uniformity within the image field on the wafer (referred to as $\Delta CD_{wafer}$) is affected by the critical dimension uniformity of the photo mask (referred to as $\Delta CD_{mask}$), so it is useful to compensate for any non-uniformity of the critical dimension of the photo mask before using the photo mask to produce the circuit layer on the wafer. The critical dimension distribution of the photo mask can be measured by placing "ghost patterns" or "ghost pattern targets" at various locations on the photo mask that are not occupied by patterns (referred to as "circuit patterns") that correspond to circuit components, and measuring the uniformity of the ghost pattern targets across the photo mask. The ghost pattern targets are configured such that they do not print under nominal conditions for dose and focus used for fabricating the circuit layer on the wafer.

When fabricating the circuit layer on the wafer, a photoresist layer is deposited on the wafer, and the circuit patterns are transferred to the photoresist layer when a nominal exposure dose is applied. The ghost pattern targets have shapes and dimensions selected such that they do not form resist features after resist development when the exposure dose is within a first range of exposure doses that includes the nominal exposure dose. Instead, the ghost pattern targets may form resist features when the exposure dose is within the second range that is outside of the first range.

In the examples below, unless otherwise noted, it will be assumed that a positive tone photoresist is used, in which the portion of the photoresist that is exposed to light becomes soluble to a photoresist developer. The portion of the photoresist that is unexposed remains insoluble to the photoresist developer. The light used to expose the photoresist has a wavelength that depends on the lithography process and can be, for example, ultraviolet light or deep ultraviolet light.

In the description below, the term "circuit pattern," depending on context, may refer to a circuit pattern on the photo mask, a resist feature on the wafer made by printing a photo mask circuit pattern in a resist layer, or a circuit pattern (i.e. as etched resist feature) on the wafer that corresponds to the circuit pattern on the photo mask. The term "ghost pattern," depending on context, may refer to a ghost pattern on the photo mask, a ghost pattern printed as resist feature that is transferred from the ghost pattern on the photo mask, or a ghost pattern on the wafer that corresponds to the ghost pattern on the photo mask. Printing a pattern on a wafer refers to printing the pattern in one or more layers on the wafer, such as a photoresist layer or a silicon oxide layer on the wafer, In general, an electronic circuit is fabricated on a wafer using a set of photo masks, each photo mask corresponding to a patterned layer (e.g., a patterned metal layer, oxide layer, or poly-silicon layer) of the electronic circuit. Although the completed electronic circuit may be densely populated with circuit components, each individual patterned layer may have considerable open spaces that are not occupied by any circuit features. Thus, although the aggregate circuit patterns from the entire set of photo masks may be densely populated with features, each individual photo mask may have considerable open spaces that are not occupied by any circuit feature. The ghost pattern targets can be placed at these open spaces. The coordinates of the ghost pattern targets may correspond to circuit components in other photo masks, but because the ghost pattern targets do not print under nominal conditions, the ghost pattern targets do not interfere with printing of the circuit components in the other photo masks.

For circuits (such as memory circuits) that have many repeating patterns, the circuit patterns can be evaluated to determine critical dimension distribution across the photo mask. For circuits (such as logic circuits) that do not have many repeating patterns, one can use ghost patterns that are specifically designed to evaluate critical dimension distribution.

An advantage of using ghost pattern targets is that there is more flexibility in the placement of the ghost pattern targets, so that critical dimension distribution can be measured across a larger portion of the photo mask with a higher density of measurement points. If, instead of using ghost pattern targets, patterns that print under nominal conditions were used for critical dimension measurement, those patterns would have to be placed outside of the active areas having circuit components, such as in scribe lines between chips. In that case, it would be difficult to determine critical dimension distribution within the active area, i.e., it would be difficult to determine intra-die or intra-field critical dimension distribution.

FIG. 1 is a flow diagram of an example work flow 80 for using ghost patterns for improving critical dimension uniformity. In the work flow 80, ghost pattern targets are supplied and implemented in the product mask layout 82. The ghost pattern targets can be implemented in sufficiently large un-patterned areas of the photo mask. For bright field masks, un-patterned light field areas are chosen for the placement of the ghost pattern targets. For dark field masks, sufficiently large un-patterned absorber-covered areas are chosen for the placement of the ghost pattern targets. The ghost pattern targets are distributed as regularly and densely as possible across the whole photo mask.

In the description below, a Cartesian coordinate system is used as a reference for determining the coordinates of features on the photo mask and the wafer.

In some implementations, the geometry of ghost patterns resembles the geometry of critical features in the circuit pattern, but with different dimensions. For example, the pitch of the ghost pattern elements in the x- or y-direction corresponds to the pitch of the elements of the critical features of the product mask in the x- or y-direction, respectively. The dimensions of the feature elements of the ghost pattern target are chosen such that the ghost patterns will not print as resist features at nominal conditions for dose and focus (whereas the circuit patterns will print under the nominal conditions). Furthermore, the ghost pattern targets will not print within a predefined relative dose variation range AD/Dnom of the nominal exposure dose, i.e., the ghost pattern targets will not print when the exposure dose is between Dnom*(1−ΔD/Dnom) and Dnom*(1+ΔD/Dnom), where Dnom represents the nominal exposure dose. This dose variation range is defined by typical lithography process variations, for instance, by the 3s-value of the process dose variation and a process safety add-on dose. Therefore, the presence of the ghost pattern targets on the photo mask will not disturb the integrated circuit features of the effective layer (i.e., the layer fabricated using the photo mask) nor succeeding layers or preceding layers.

The measurand values of the ghost pattern targets are measured 84. In this example, the measurand is critical dimension, and the measurand values can be measured by critical dimension scanning electron microscopy (CD SEM) or scatterometry. The measured critical dimension data are used to determine a mean critical dimension and local deviations from the mean value $\Delta CD_{Mask}(x,y)$ across the mask area 86. The wafer critical dimension variation within the image field contributed by the mask critical dimension variation is determined 88. The mask-induced wafer critical dimension uniformity $\Delta CD_{wafer-M}(x, y)$ can be determined by the following formula:

$$\Delta CD_{wafer-M}(x,y)=0.25 * MEEF * \Delta CD_{Mask}(x,y).$$

Here, a demagnification of 4 is assumed, and the printed resist feature related mask error enhancement factor (MEEF) is applied to convert the mask level error to the wafer level error.

Measurement data of the relative intensity variation along scanner slit axes $\Delta I_{rel-Slit}(x)$ (x represents slit length) and the critical dimension-versus-relative dose gradient $(\Delta CD/\Delta D_{rel})$ are provided 90.

The scanner contribution to the critical dimension uniformity resulting from non-homogeneity of the scanner slit intensity is determined 92, using the formula:

$$\Delta CD_{Slit-f}(x,y)=(\Delta CD/\Delta D_{rel}) * \Delta T_{rel-Slit}(x).$$

The contributions of the mask and the scanner to the wafer level critical dimension uniformity are determined 94, using the formula:

$$\Delta CD_{wafer-total}(x,y)=\Delta CD_{Wafer-M}(x,y)+\Delta CD_{Slit-f}(x,y).$$

If there is non-uniformity in the wafer level critical dimension, the photo mask can be modified to compensate for the non-uniformity. Using information about the total wafer critical dimension variation distribution, the transmission distribution across the photo mask that would result in uniform critical dimension distribution on the wafer is determined 96. In some implementations, the photo mask can be modified by using a laser beam to vary the optical properties of the mask blank at specific regions to change the transmittance at the specific regions. The transmission-corrected mask is used for product wafer exposure using an exposure dose that provides the target critical dimension of the corresponding active layout feature 98.

In some implementations, a correction factor can be applied to the determined mask induced wafer critical dimension variation $\Delta CD_{Mask}(x, y)$, which considers experienced critical dimension difference ranges of the ghost pattern targets and corresponding active layout features. A further correction factor to the exposure tool induced wafer critical dimension variation is designated to correct for contributions caused by intra- and inter-field flare of the projection system.

In some implementations, instead of measuring the mask critical dimension uniformity, for dark ghost pattern targets of a bright field mask, the product mask is exposed onto a wafer with an exposure dose below the nominal dose of the active target features such that the elements of the ghost pattern targets print as resist features. The critical dimensions of the resist features are measured and the critical dimension deviation $\Delta CD'_{wafer-GPT}(x, y)$ from the mean value across the image field is determined, which is used as input for a critical dimension correction process.

In some implementations, a correction factor can be applied to the ghost pattern target critical dimension uniformity, which considers the MEEF differences of the ghost pattern targets and the corresponding active product features at the printing conditions.

The following describes example geometries of ghost patterns. For example, basic geometries of the ghost pattern targets include dark and light field gratings, dark isolated lines, isolated spaces, contacts and pillars, and arrangements of them.

FIG. 2 is a diagram of an example active product feature 190 and a corresponding ghost pattern 192 for a bright field mask. In this example, the active product feature 190 is an opaque line, and the corresponding ghost pattern 192 is also an opaque line. The width of the ghost pattern 192 is smaller than that of the active product feature 190. The width of the line in the ghost pattern 192 is selected such that the ghost pattern 192 will not print under a nominal exposure dose for which the active product feature 190 will print. Further, to provide some safety margin, the width of the line in the ghost pattern 192 is selected such that the ghost pattern 192 will not print within a predetermined relative dose variation range AD/Dnom of the nominal exposure dose.

FIG. 3 is a diagram of an example active product feature 150 and a corresponding ghost pattern 160 for a positive tone type mask. In this example, the active product feature 150 includes a line/space array pattern having opaque lines 152 with transparent spacing 154 between the lines 152. The corresponding ghost pattern 160 also includes a line/space array pattern having opaque lines 162 with spacing 164 between the lines 162. The pitch of the ghost pattern 160 is the same as that of the active product feature 150. Each line 162 in the ghost pattern 160 has a width that is smaller than the width of a corresponding line 152 in the active product feature 150.

The width of each line 162 in the ghost pattern 160 is selected such that the ghost pattern 160 will not print under a nominal exposure dose for which the active product feature 150 will print, and will also not print within a predetermined relative dose variation range ΔD/Dnom of the nominal exposure dose.

The exact dimensions of the ghost patterns depend on various factors, such as the type of pattern and the type of illumination (e.g., monopole, dipole, or quadrupole) being used.

Figure 4:
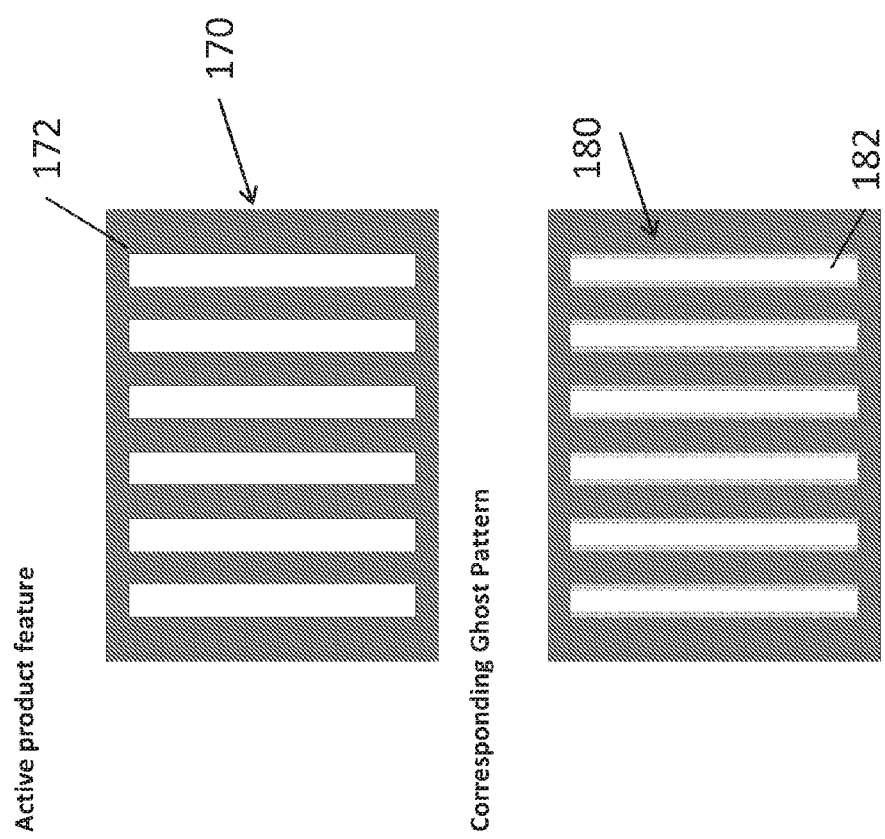
FIG. 4 is a diagram of an example active product feature and a corresponding ghost pattern for a dark field mask.

FIG. 4 is a diagram of an example active product feature 170 and a corresponding ghost pattern 180 for a dark field mask. In this example, the active product feature 170 includes a line/space array pattern having transparent spaces 172. The corresponding ghost pattern 180 also includes a line/space array pattern having transparent spaces 182. The pitch of the ghost pattern 180 is the same as that of the active product feature 170.

Each line 182 in the ghost pattern 180 has a width that is smaller than the width of a corresponding line 172 in the active product feature 170. The width of each line 182 in the ghost pattern 180 is selected such that the ghost pattern 180 will not print under a nominal exposure dose for which the active product feature 170 will print, and will also not print within a predetermined relative dose variation range ΔD/Dnom of the nominal exposure dose.

In this description, the ghost pattern targets can also be called sub-resolution targets. Note that the ghost pattern targets are different from sub-resolution assist features. The sub-resolution assist features are placed near circuit features and designed such that although the sub-resolution assist features themselves do not print under the nominal exposure dose, the sub-resolution assist features assist or modulate printed images of the circuit features so that the circuit features can be printed more accurately. The ghost pattern targets described herein are placed sufficiently far away from circuit patterns such that the ghost pattern targets have substantially no effect on the circuit patterns under the nominal exposure dose.

Figure 5:
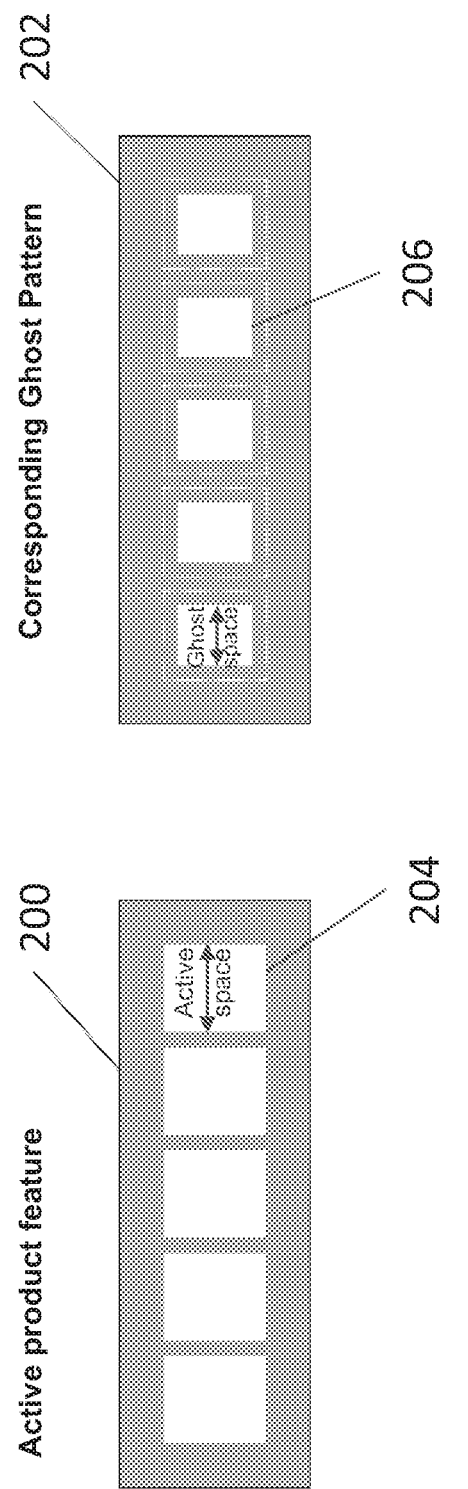
FIG. 5 is a diagram of an example active product feature and a corresponding ghost pattern for a dark field mask.

FIG. 5 is a diagram of an example active product feature 200 and a corresponding ghost pattern 202 for a dark field mask. In this example, the active product feature 200 includes a chain of transparent contact openings 204. The corresponding ghost pattern 202 also includes a chain of transparent openings 206. The pitch of the ghost pattern 202 is the same as that of the active product feature 200.

Each opening 206 in the ghost pattern 202 has a size that is smaller than that of a corresponding opening 204 in the active product feature 200. The size of each opening 206 in the ghost pattern 202 is selected such that the ghost pattern 202 will not print (e.g., will not generate openings in a photoresist layer) under a nominal exposure dose for which the active product feature 200 will print. The ghost pattern 202 will also not print when the exposure dose varies from the nominal dose within a predetermined relative dose variation range AD/Dnom.

In the examples shown in FIGS. 2 to 5, the ghost patterns will not disturb the patterning of the active product features in the corresponding layer and subsequent layers. The ghost patterns are positioned sufficiently far away from the active product features so that the ghost patterns will not affect the patterning of the active product features. The ghost patterns will not have any detectible impact on the electrical functionality of the circuit. In some implementations, one type of ghost patterns is distributed as homogeneously and regularly as possible across the photo mask. In some implementations, two or more types of ghost patterns are distributed as homogeneously and regularly as possible across the photo mask.

Ghost patterns other than those shown in FIGS. 2 to 5 can also be used. For example, in some implementations, it is possible to use ghost pattern targets having pitches that deviate slightly from the pitch of the elements of the critical layout features. In such examples, a corrective factor can be applied to the determined mask induced wafer critical dimension variation, which corrects for differences in MEEF. For example, when a critical feature is a line/space array of 100 nm pitch and dark 35 nm line, the corresponding ghost pattern target may have a grating with a pitch of 125 nm and a line width of 27 nm. The ghost pattern target will not print, but can be used to generate critical dimension uniformity data. Alternatively, the corresponding ghost pattern target can also be an isolated line, a double line, or a triple line, etc. (having a number of lines less than the number of lines in the critical feature). For example, if there is a small un-patterned area that is not large enough to place a ghost pattern target that is a line/space array having the same number of lines as that of the critical feature, a ghost pattern target having a smaller number of lines or line can be placed in the small un-patterned area. For example, when a critical feature is an array or chain of contact openings, the corresponding ghost pattern target can be an isolated opening, two openings, or three openings, etc. (having a number of openings less than the number of openings in the critical feature), allowing the ghost pattern target to fit within a smaller un-patterned area.

There are several methods for measuring mask critical dimensions in addition to the scanning electron microscopy or scatterometry, such as techniques based on optical imaging (AIMS/WLCD) or mask transmission measurement. The goal of these measurements is to determine, directly or indirectly, the critical dimension of the ghost pattern targets.

Figure 6:
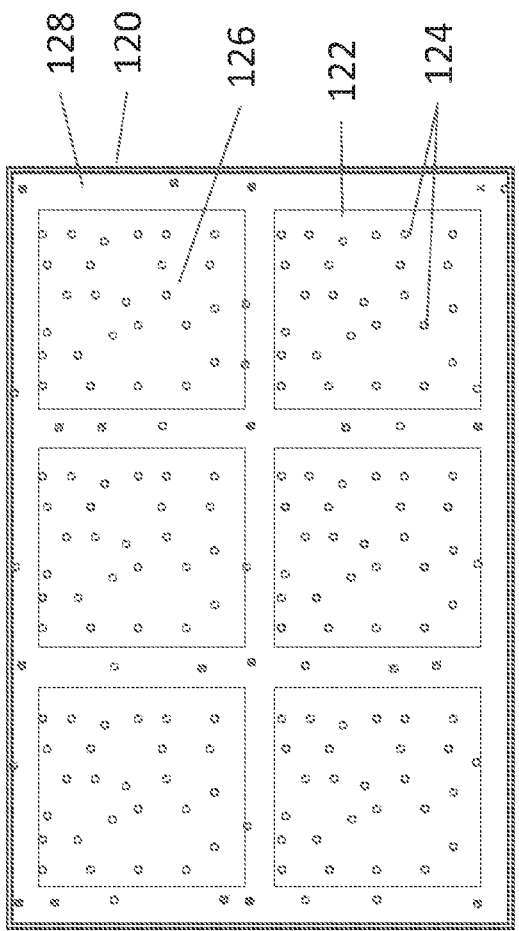
FIGS. 6 and 7 are diagrams of example photo masks having ghost pattern targets.

FIG. 6 is a diagram of an example photo mask 120 having ghost pattern targets. In some implementations, the photo mask 120 may include patterns for several chips or dies 122. Ghost pattern targets 124 (represented by small circles) may be placed in active chip areas 126 and in areas 128 outside of the active chip areas 126 (such as in scribe lines) with a high density. The ghost pattern targets can be used to measure intra-field critical dimension uniformity (i.e., critical dimension uniformity within an image field, which may include several chips or dies) and intra-die critical dimension uniformity (i.e., critical dimension uniformity within a die). FIG. 6 only shows a portion of the photo mask 120, which can include patterns for additional chips and other information (such as mask description, serial number, and bar code).

Figure 7:
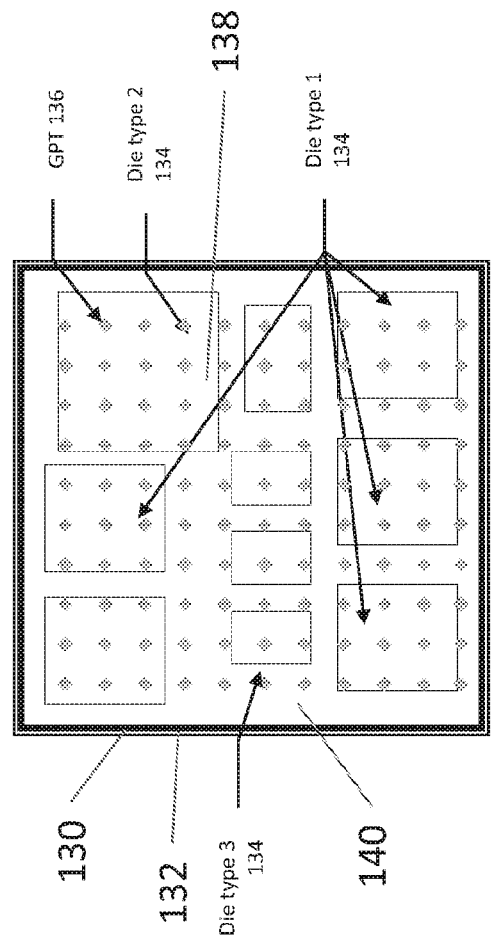

FIG. 7 is a diagram of another example photo mask 130 having ghost pattern targets. In some implementations, the photo mask 130 may include patterns for a system-on-a-chip in which a chip 132 includes several types of dies 134. Ghost pattern targets 136 (represented by small diamonds) may be placed in active chip areas 138 and in areas 140 outside of the active chip areas 138 with a high density. The ghost pattern targets can be used to measure inter-die, intra-die and intra-field critical dimension uniformity. FIG. 7 only shows a portion of the photo mask 130, which can include patterns for additional chips and/or dies and other information.

Figure 8:
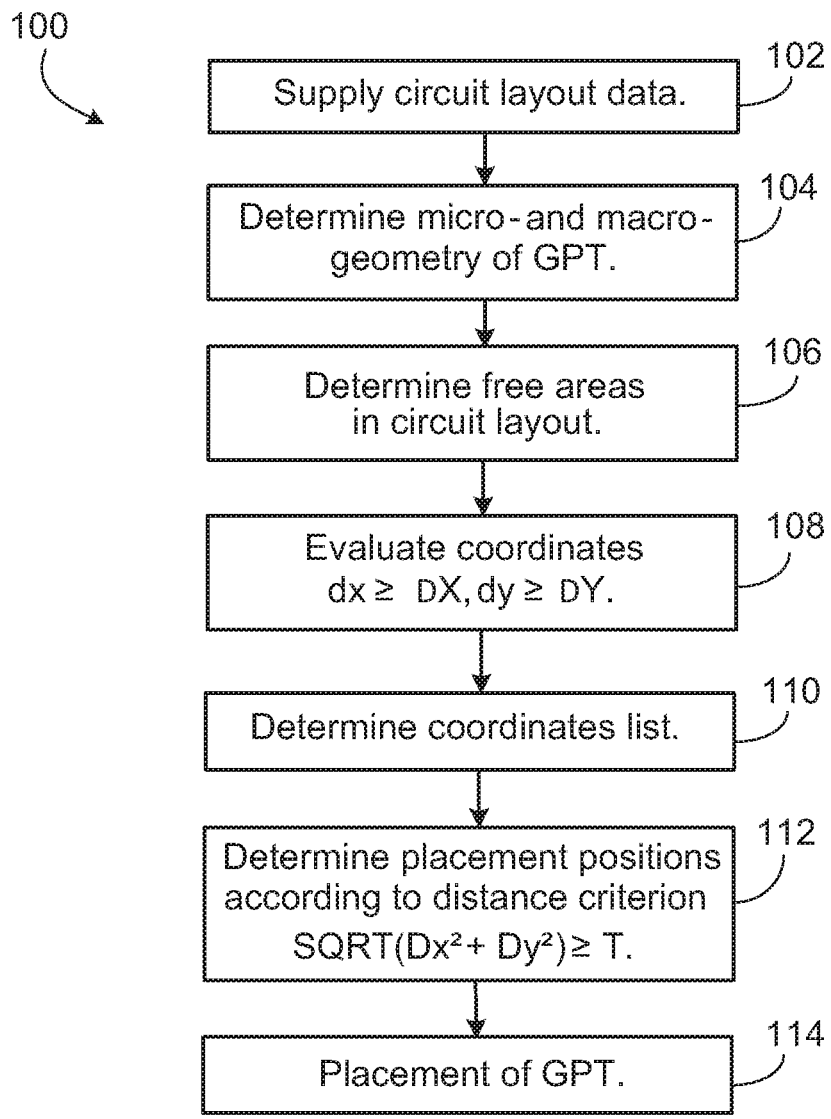
FIG. 8 is a flow diagram of an example process for determining the placement of ghost pattern targets.

FIG. 8 is a flow diagram of an example process 100 for determining the placement of ghost pattern targets. In the process 100, layout data for a circuit layer is provided 102. The micro- and macro-geometry of the ghost pattern targets are determined 104. For example, a ghost pattern target may include two or more features, such as a set of parallel lines. In this example, the macro-geometry refers to the geometry of the set of parallel lines, whereas the micro-geometry refers to the geometry of the individual lines. The free areas (or free spaces or un-patterned areas) in the layout are determined 106.

The coordinates for possible ghost pattern target placement are evaluated 108 to determine whether dx≥DX and dy≥DY. DX and DY are the macro sizes of the ghost pattern targets. The parameters dx and dy represent the size of the available open area for a specific layout region.

A list of coordinates of the center of gravity of free spaces sufficiently large for the placement of the ghost pattern target is determined 110. The placement of the positions of the ghost pattern targets is determined 112 according to a distance criterion Tmax≥SQRT(Dx$^2$+Dy$^2$)≥Tmin. In selecting placement of the positions of the ghost pattern targets, preferably the distance between any two targets does not fall below Tmin and does not exceed Tmax. This is a general design rule, but some exception can be made depending on constraints of the un-patterned areas. The ghost pattern targets are placed 114 at the positions based on the evaluation above. The distances between the ghost pattern targets should be about comparable, and the ghost pattern targets should be distributed across the layout as homogeneously and regularly as possible. In some implementations, about 300 to 500 ghost pattern targets are placed on the photo mask to provide sufficient measurement points for determining critical dimension uniformity of the photo mask.

FIG. 9 is a diagram of an example active product feature 280 on a bright field photo mask that is illuminated using an asymmetric illumination 282 when printing the active product feature 280 onto a production wafer. A corresponding ghost pattern 284 is illuminated using an asymmetric illumination 286 when measuring the critical dimension of the ghost pattern 284. The active product feature 280 is a line/space array having opaque lines 288 that extend along the y-direction. The ghost pattern 284 is a line/space array having opaque lines 290 that are rotated 90° relative to the opaque lines 288 in the active product feature 280 and extend along the x-direction. The asymmetric illumination 286 is also rotated 90° relative to the asymmetric illumination 282.

The product mask having the active product feature 280 is exposed at nominal conditions to print the active product feature onto the photoresist layer. The rotated ghost pattern target 284 will not be printed in the photoresist layer under the nominal conditions. This holds true at strong x-y asymmetry of the illumination source, such as an asymmetric quadrupole or dipole illumination.

The following describes the use of ghost pattern targets for improving critical dimension uniformity. For example, there are two methods for measuring the ghost pattern targets. In a first method, an imaging tool detects images of ghost patterns projected onto a detector, and the detected images are analyzed to determine the critical dimensions of the ghost pattern targets. In a second method, the ghost pattern targets are transferred onto a photoresist layer, and the patterned photoresist layer is analyzed to determine the critical dimensions of the ghost pattern targets.

Figure 10:
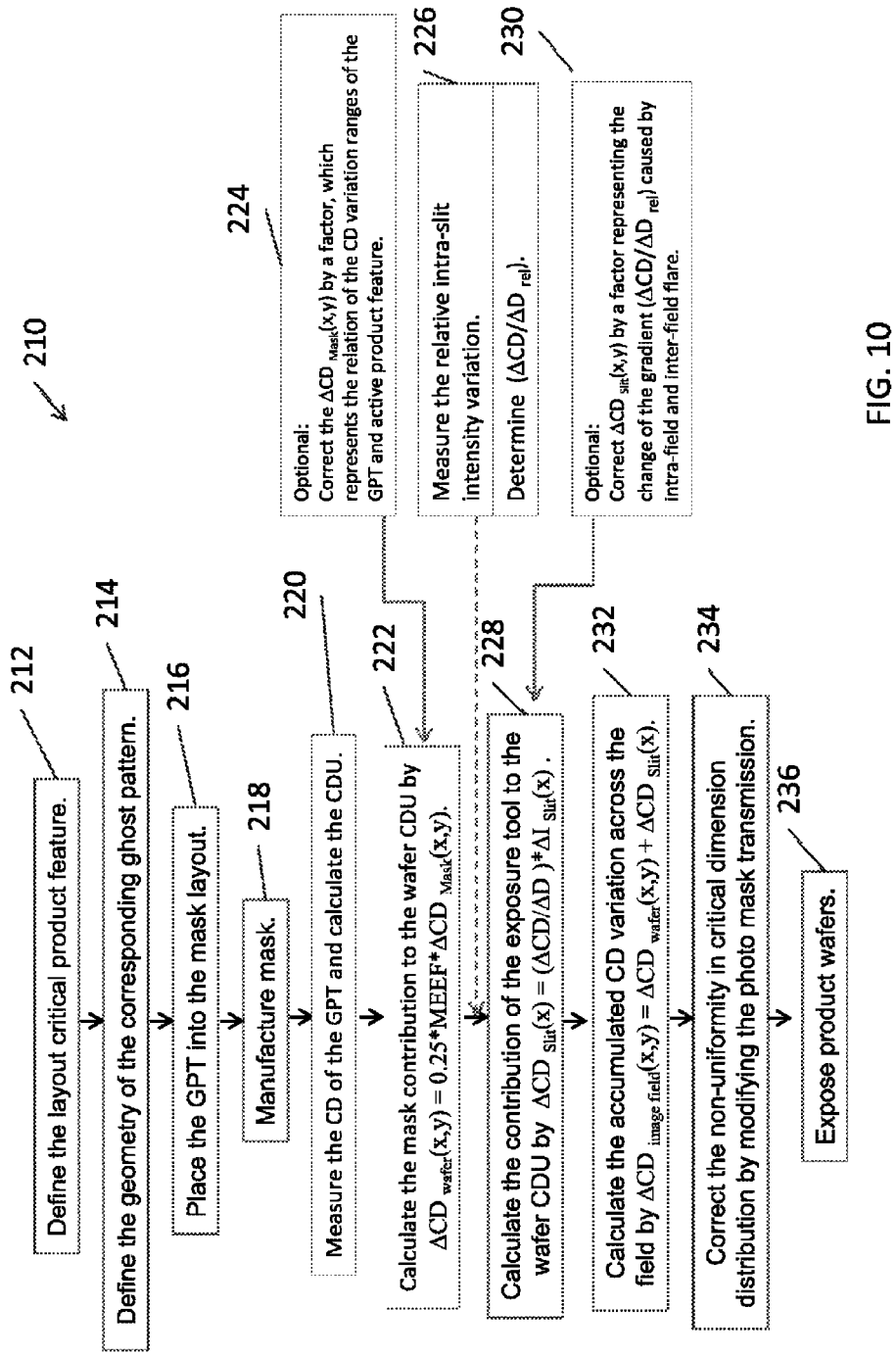
FIGS. 10 and 11 are flow diagrams of example processes for using ghost pattern targets for improving critical dimension uniformity.

FIG. 10 is a flow diagram of an example process 210 for using ghost pattern targets for improving critical dimension uniformity by using an imaging tool to detect the ghost pattern targets. In the process 210, the layout of a critical product feature is defined 212. The geometry of the corresponding ghost pattern is defined 214. The ghost pattern targets are placed into the mask layout 216. The photo mask is manufactured 218. The critical dimensions of the ghost pattern targets are measured, and the critical dimension uniformity of the photo mask is calculated 220. For example, the photo mask can be illuminated, and images of the ghost pattern targets are detected using an aerial imaging tool for mask critical dimension metrology, such as Wafer Level Critical Dimension Metrology (WLCD) Tool, available from Carl Zeiss SMS, Germany. The detected images of the ghost pattern targets are analyzed to determine the critical dimensions of the ghost pattern targets.

The contribution to the wafer critical dimension uniformity from the photo mask is calculated 222, by using the formula:

$$\Delta CD_{wafer}(x,y)=0.25*MEEF^{AIMS}*\Delta CD_{Mask}(x,y).$$

In this example, a 4:1 reduction of the photo mask pattern is used, hence the 0.25 factor. A mask error enhancement factor (MEEF$^{AIMS}$) for the aerial image detection technique is applied to convert the mask level error to the related wafer level error.

Optionally, $\Delta CD_{Mask}(x,y)$ can be corrected by a factor, which represents the relation of the mask critical dimension variation ranges of the ghost pattern target and the active product feature 224.

The relative intra-slit intensity variation $\Delta I_{Slit}(x)$ is measured and the ratio of critical dimension variation versus dose variation ($\Delta CD/\Delta D_{rel}$) is determined 226. The contribution of the exposure tool to the wafer critical dimension uniformity is calculated 228, by using the formula:

$$\Delta CD_{Slit}(x)=(\Delta CD/\Delta D)*\Delta I_{Slit}(x).$$

Optionally, $\Delta CD_{Slit}(x,y)$ can be corrected by a factor representing the change of the gradient ($\Delta CD/\Delta D_{rel}$) caused by intra-field and inter-field flare 230.

The accumulated critical dimension variation across the field has contributions from the wafer and the scanner, and can be calculated 232, by using the formula:

$$\Delta CD_{image\,field}(x,y)=\Delta CD_{wafer}(x,y)+\Delta CD_{Slit}(x).$$

The non-uniformity in critical dimension distribution is corrected by modifying the transmission profile across the photo mask 234. In some implementations, the photo mask can be modified by using a laser beam to vary the optical properties of the mask blank at specific regions to change the transmittance at the specific regions. The photo mask is used to expose product wafers to fabricate electronic circuits on the wafers 236.

Figure 11:
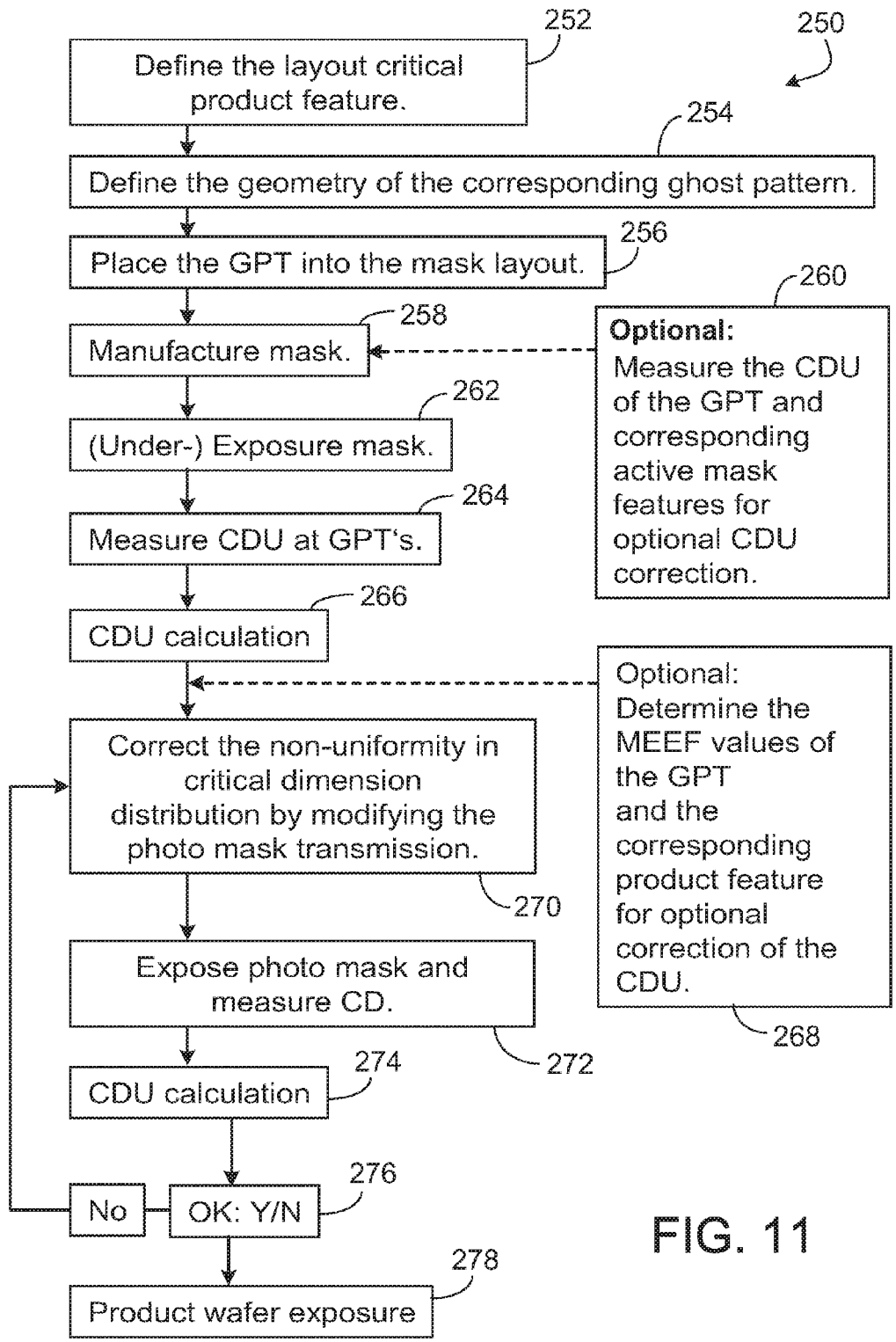

FIG. 11 is a flow diagram of an example process 250 for using ghost pattern targets for improving critical dimension uniformity by printing the ghost pattern targets on a photoresist layer and measuring the critical dimension distribution of the ghost pattern targets on the photoresist features. In the process 250, the layout of a critical product feature is defined 252. The geometry of a corresponding ghost pattern target is defined 254. The ghost pattern targets are placed into the mask layout 256. The photo mask is manufactured 258. Optionally, the critical dimension uniformity of the ghost pattern targets and the corresponding active mask features are measured 260 in order to apply optionally a critical dimension uniformity correction.

The photo mask is exposed to transfer the ghost pattern targets from the photo mask to a photoresist layer on a wafer 262. For example, the photo mask may be appropriately under-exposed (compared to the exposure dose used to print circuit patterns).

The critical dimensions of the printed ghost pattern targets are measured 264. The critical dimension uniformity is calculated 266. Optionally, the MEEF values of the ghost pattern targets and the corresponding product features are determined for optional correction of the critical dimension uniformity 268. This can be done using an appropriately prepared test wafer.

The non-uniformity in critical dimension distribution is corrected by modifying the transmission profile across the photo mask blank 270. In some implementations, the photo mask can be modified by using a laser beam to vary the optical properties of the photo mask blank at specific regions to change the transmittance there. The photo mask is printed, and the critical dimensions of the ghost pattern targets are measured 272. This can be done again using the appropriately prepared test wafer after resist removal.

After the critical dimensions of the ghost pattern targets on the photoresist layer are measured, the critical dimension uniformity is calculated 274. The critical dimension uniformity is evaluated 276 to determine whether it meets a predetermined quality standard. If the critical dimension uniformity meets a predetermined quality standard, the photo mask is used to expose 278 product wafers to fabricate electronic circuits on the wafers. If the critical dimension uniformity does not meet the predetermined quality standard, then steps 270, 272, and 274 are repeated to compensate any remaining non-uniformity in the critical dimension distribution, until the critical dimension uniformity meets the quality standard, or other end-of-iteration criteria is met.

In some implementations, ghost pattern targets are used to improve mask pattern registration, and the measurand is the displacement of targets from their design positions. Similar to the ghost patterns used for measuring critical dimension distribution, the ghost patterns used for measuring mask pattern registration are designed such that they do not print at nominal dose, and will not print when the exposure dose is within a predetermined margin of the nominal dose. The margin depends from the process stability and can be, for example, in a range from 5% to 30%.

Therefore, the ghost patterns for mask registration will not disturb the chip manufacturing process of the layer and will have no impact on the layout of the preceding and succeeding layers and corresponding mask designs.

The registration ghost patterns are designed by selecting dimensions smaller than the smallest active product feature that can be printed under the nominal exposure dose. The ghost patterns for mask registration are placed within free spaces of the active chip layout across the whole mask as homogeneously as possible. The registration ghost pattern targets can be placed in bright areas of a bright field mask or dark regions of a dark field mask. This allows a precise characterization of the registration performance of the photo mask. This is an improvement over previous methods that place printing targets in the scribe lines.

In some implementations, the registration ghost pattern targets consist of crosses or angles of small lateral width. The registration ghost pattern targets can also be designed as an assembly of lines, spaces, contacts or pillars. The elements of the registration ghost pattern targets can have features that have the same x- and y-pitches as the critical active features. In this case, the registration ghost patterns will have the same lens aberration induced lateral shift during wafer print as the active pattern. This way, the registration ghost patterns will describe more accurately the real behavior after print than standard registration measurement targets. The registration ghost patterns can be designed with varying x-y symmetry. This will further improve the exposure dose safety printing margin when asymmetric illumination is used for the mask pattern projection.

The following describes examples of registration ghost pattern targets.

Figure 12A:
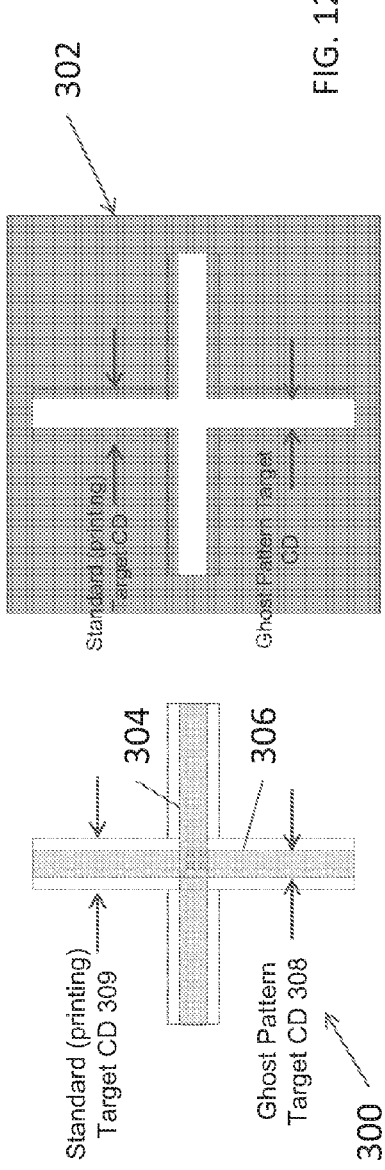
FIGS. 12A, 12B, and 13 are diagrams of example registration ghost pattern targets for bright field masks and dark field masks.

FIG. 12A is a diagram of an example registration ghost pattern target 300 for a bright field mask, and a registration ghost pattern target 302 for a dark field mask. The registration ghost pattern target 300 or 302 includes a bar 304 that extends in the x-direction and a bar 306 that extends in the y-direction. The two bars 304, 306 intersect to form a cross-shaped pattern. The registration ghost pattern critical dimension 308 is smaller than the standard (printing) target critical dimension 309. This way, the registration ghost pattern target 300 will not print under a nominal exposure dose for which active product features will print.

The dimensions of the registration ghost pattern targets are selected such that no resist feature is printed on a photoresist layer at nominal printing conditions. At appropriate reduced (bright field mask) or enlarged (dark field mask) dose, the registration ghost pattern targets can be printed as resist features and used for wafer registration measurement.

Figure 12B:
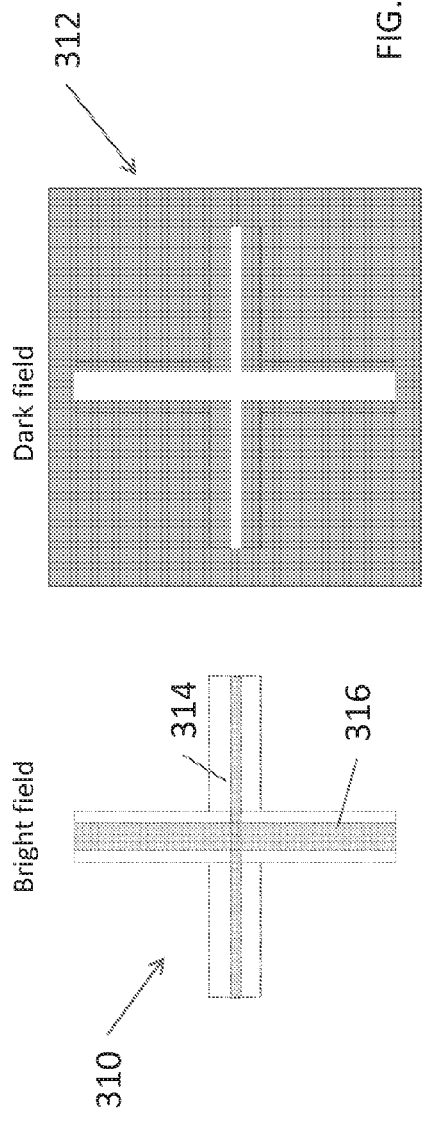

FIG. 12B is a diagram of an example registration ghost pattern target 310 for a bright field mask, and a registration ghost pattern target 312 for a dark field mask. The registration ghost pattern targets 310 and 312 are similar to the registration ghost pattern targets 300 and 302, respectively. However, the registration ghost pattern target 310 has a bar 314 that extends in the x-direction, and a bar 316 that extends in the y-direction, and the width of the x-bar 314 is different from the width of the y-bar 316. Similarly, the registration ghost pattern target 312 has an x-bar and a y-bar having different widths. This type of registration ghost pattern targets 310 and 312 can be used when there is asymmetric illumination. The difference in width of the bars in the x- and y-directions reflects the difference in the critical dimensions for the x- and y-directions due to asymmetric illumination.

Figure 13:
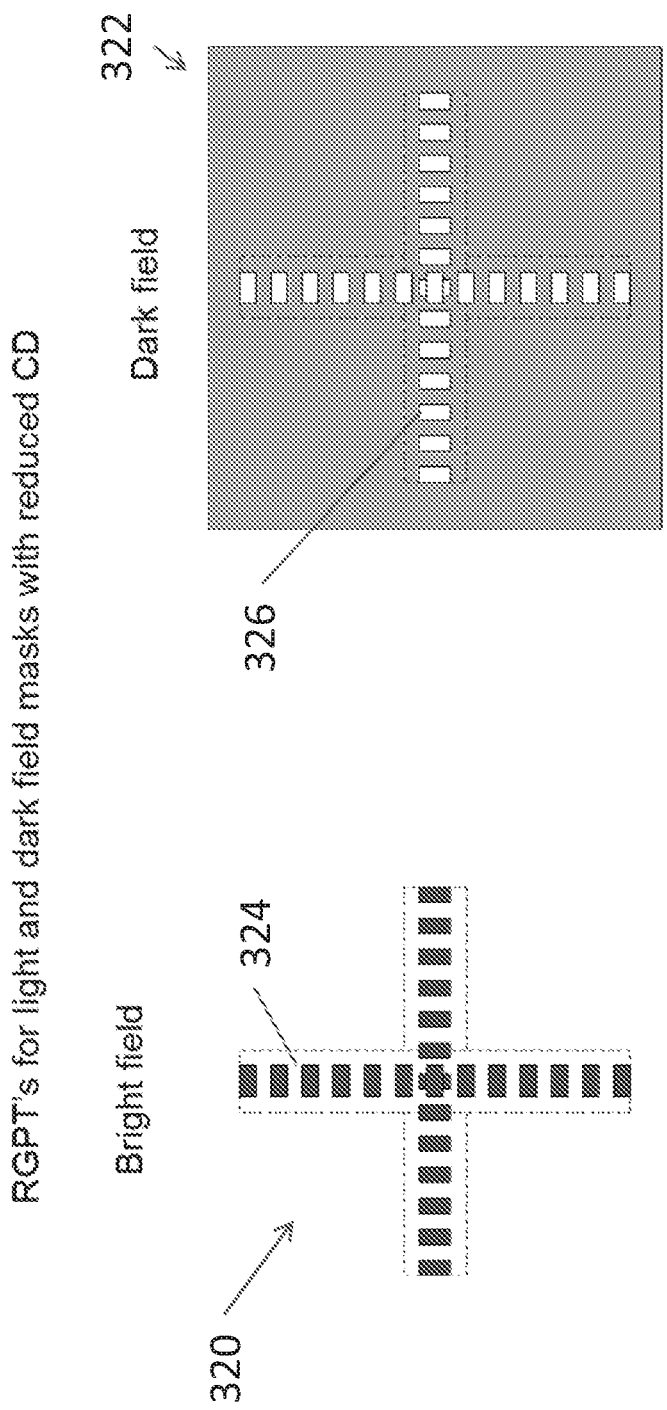

FIG. 13 is a diagram of an example registration ghost pattern target 320 for a bright field mask, and an example registration ghost pattern target 322 for a dark field mask. Each main bar in the registration ghost pattern target 320 is resolved into a set of small bars 324, and each main space in the registration ghost pattern target 322 is resolved into a set of small openings 326. The registration ghost pattern targets 320 and 322 can be measured using exposure dose different from the nominal dose, but the registration ghost pattern targets will not print at nominal exposure conditions.

FIGS. 14A to 14D are diagrams of example registration ghost pattern targets 330, 332, 334, and 336 for bright field masks. In each of the examples shown in FIGS. 14A to 14D, the main bar is resolved into a set of small bars, and different designs are provided in the x- and y-directions because of asymmetric illumination conditions. In the examples shown in FIGS. 14A to 14D, only the bar in the y-direction is changed (as compared to the example in FIG. 13). It is also possible to change the bar in the x-direction, or change both bars. Feature assembly in the registration ghost pattern target correlates to the assembly of the most critical active feature, specifically pitch. Different registration ghost pattern targets can be used to measure the wafer related registration. The wafer related registration measurement is possible using a dose for wafer exposure that is different from the nominal exposure dose, but the registration ghost patterns will not print at nominal exposure conditions.

In the example shown in FIG. 14C, the segments in the vertical bar extend along directions that are at an angle relative to the x-direction, the angle being in a range between 0 to 90°. For example, the angle can be about 13° or 23°, or other angles. Either orthogonal illumination or tilted illumination can be used for printing.

FIGS. 15A to 15F are diagrams of example registration ghost pattern targets 340, 342, 344, 346, 348, and 350 for bright field masks. Referring to FIG. 15A, the registration ghost pattern target 340 includes four elements (quarter surroundings) 352, 354, 356, and 358 that define a transparent cross-shaped registration mark 360. The elements 352, 354, 356, and 358 include thin lines that will not print under nominal exposure dose used to print active circuit features. When the elements 352, 354, 356, and 358 are not printed, the transparent cross-shaped registration mark 360 does not show up, thus the registration ghost pattern target 340 will not have any effect on the circuit components. The elements 352, 354, 356, and 358 can be measured after print using an appropriate under-exposure dose.

The registration ghost pattern targets 342, 344, 346, 348, and 350 each has four elements that will not print under nominal exposure dose, but can be measured using appropriate under-exposure on test wafers. The elements of the registration ghost pattern targets 340, 342, 344, 346, 348, and 350 have different patterns that are exemplarily selected according to the most critical active features of the circuit layout.

FIGS. 16A to 16F are diagrams of example registration ghost pattern targets 370, 372, 374, 376, 378, and 380 for dark field masks. In each example, a cross mark appears as a dark feature in optically semitransparent quarter surroundings. The features in the quarter like surroundings can be printed as resist features at appropriate over-exposure on test wafers, causing the cross mark to be visible. Under nominal exposure dose, the quarter surrounding elements will not print, so the registration ghost pattern target 370, 372, 374, 376, 378, and 380 will not have any effect on the circuit components.

Registration can be improved by measuring registration at the mask level (referred to as "mask registration") or the wafer level (referred to as "wafer registration"), then modifying the mask to correct registration errors.

Figure 17:
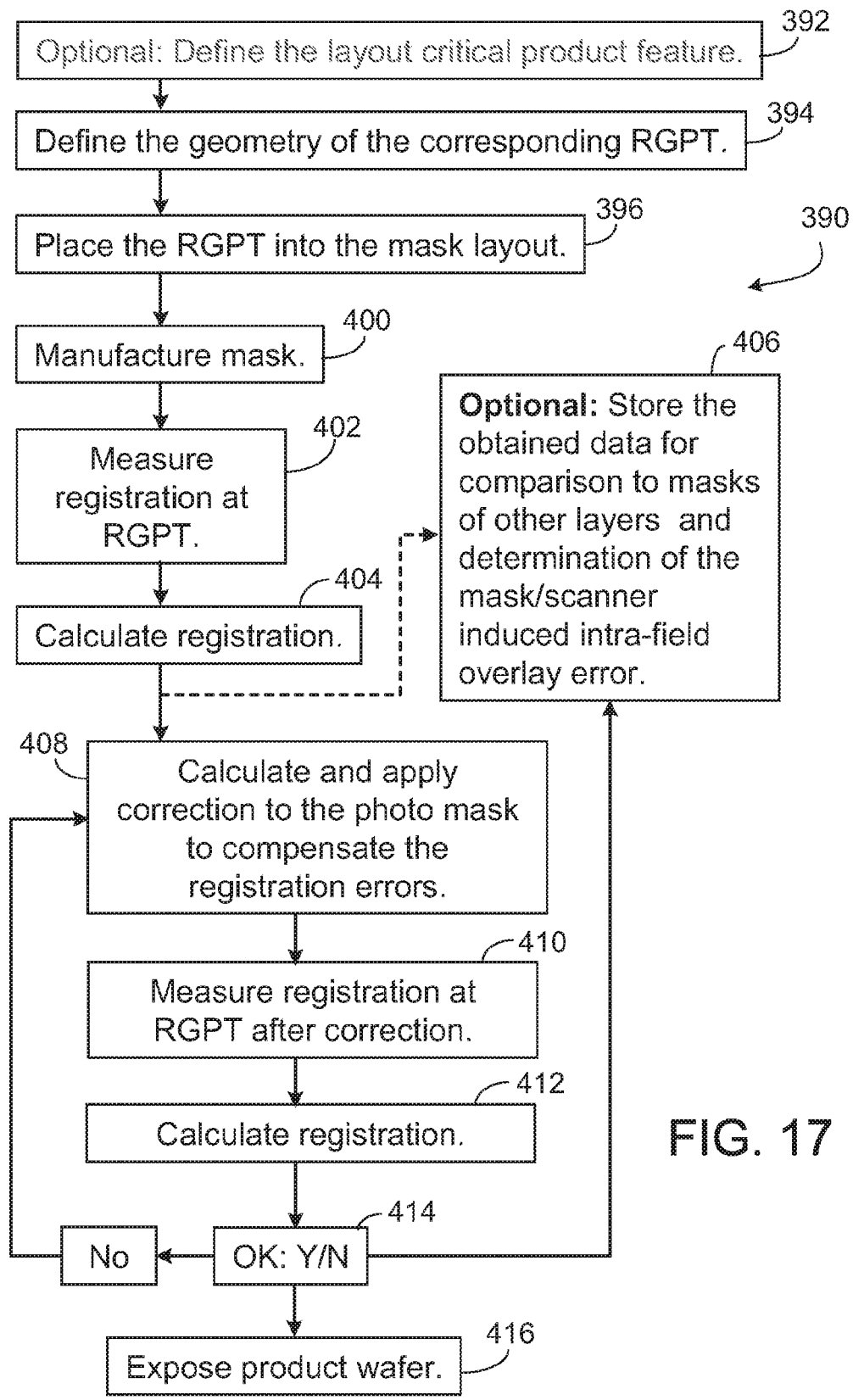
FIG. 17 is a flow diagram of a process for improving registration using the registration ghost pattern targets.

FIG. 17 is a flow diagram of a process 390 for improving registration using the registration ghost pattern targets. Measurements of the registration targets are made at the mask level. In the process 390, optionally, the layout critical product feature is defined 392. The geometry of the corresponding registration ghost pattern target is defined 394. The registration ghost pattern targets are placed into the mask layout 396. The mask is manufactured 400. Registration measurement is performed at the registration ghost pattern targets 402.

For example, the positions of registration targets on the photo mask can be measured using a registration measurement tool. Deviations of the registration targets relative to their intended positions provide information about the deviation of nearby circuit features relative to their intended position.

In the process 390, after measuring the registration targets, registration errors are calculated 404, in which the deviations of the positions of the registration targets from their intended positions are calculated. Optionally, the obtained data are stored for comparison to masks of other layers and determination of the mask/scanner induced intra-field overlay error 406.

The amount of correction that needs to be applied to the photo mask in order to compensate the registration errors is determined, and the correction is applied to the photo mask 408. In some implementations, the photo mask can be modified by using a laser beam to vary the physical properties of the photo mask blank at specific regions to change the physical density there, causing the regions to contract or expand, thereby adjusting the positions of mask patterns near the contracted or expanded regions. In some examples, laser beam pulses are used to write pixels in designated locations of the photo mask to cause localized contraction or expansion. The amount of correction in lateral positions of the patterns can be controlled by varying the writing density of the pixels. After registration error correction, the registration measurement is performed at the registration ghost pattern targets 410.

Registration calculation is performed 412. The registration is evaluated to determine whether the registration meets a predetermined quality standard 414. If the registration meets the quality standard, the photo mask is used for product wafer exposure 416. If the registration does not meet that quality standard, then steps 408, 410, and 412 are repeated until the registration meets the quality standard or other end-of-iteration criteria is met. Optionally, registration data for the corrected photo mask can be stored for later comparison 406.

Figure 18:
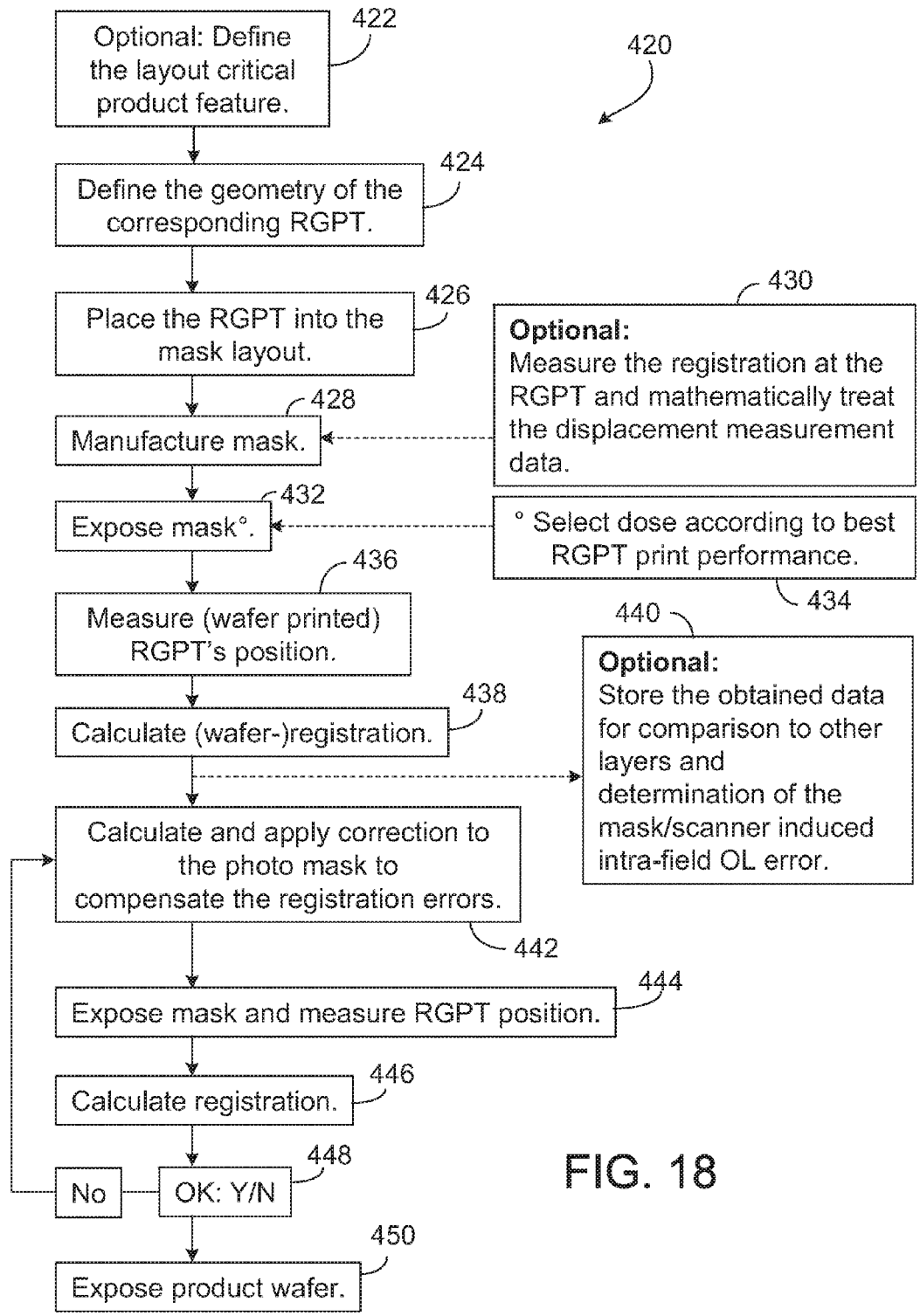
FIG. 18 is a flow diagram of a scanner-aware wafer registration improvement process using registration ghost pattern targets.

FIG. 18 is a flow diagram of a scanner-aware wafer registration improvement process 420 using registration ghost pattern targets. Measurements of the registration targets are made at the wafer level. In the process 420, optionally, the layout critical product feature is defined 422. The geometry of a corresponding registration ghost pattern target is defined 424. The registration ghost pattern targets are placed into the mask layout 426. The mask is manufactured 428. Optionally, the registration is measured at the registration ghost pattern targets and the displacement measurement data are processed using mathematical algorithms to determine the displacement of features 430.

The photo mask is exposed to print the registration ghost pattern targets on a photoresist layer of a wafer 432 (using appropriate over- or under-exposure compared to the nominal exposure dose for printing circuit patterns). The exposure dose is selected to result in the best registration ghost pattern target print performance 434. The positions of the wafer-printed registration ghost pattern targets are measured 436.

For example, the wafer can be loaded onto the registration measurement tool, and the printed registration targets can be measured by the registration measurement tool in reflection mode. Light reflecting off the wafer are detected by the imaging device, and reflected images of the printed registration targets are measured by the registration measurement tool. A reference coordinate system for the printed registration targets can be chosen in a manner similar to that for measuring mask registration.

Measuring mask registration allows determination of registration errors due to contributions from the mask. Measuring wafer registration allows determination of registration errors due to contributions from the mask and the scanner.

In the process 420, after measuring registration targets printed on the wafer, registration at the wafer level is calculated 438, in which the deviations of the positions of the printed registration targets from their intended positions are calculated. Optionally, the obtained data are stored for comparison to other layers and determination of the mask/scanner induced intra-field overlay error 440.

The amount of correction that needs to be applied to the photo mask in order to compensate the registration errors is determined, and the correction is applied to the photo mask 442. After registration error correction, the mask is exposed to print the registration ghost pattern targets in a new photoresist layer, and the positions of the registration ghost pattern targets are measured 444. Registration is calculated 446. The registration is evaluated to determine whether the registration meets a predetermined quality standard 448. If the registration meets the quality standard, the photo mask is used for product wafer exposure 450. If the registration does not meet the quality standard, then steps 442, 444, and 446 are repeated until the registration meets the quality standard or other end-of-iteration criteria is met. Optionally, registration data for the corrected photo mask can be stored for later comparison 440.

The following describes the use of registration ghost pattern targets for overlay improvement.

In some implementations, registration ghost pattern targets can be used to evaluate wafer overlay between successive layers by measuring the relative local lateral displacement between successive layers. For example, the registration ghost pattern targets are projected by the scanner onto a test wafer using a dose below (for a bright field mask) or respectively above (for a dark field mask) the nominal dose such that the registration ghost pattern targets will print as resist features.

The positions of the resist features printed per mask are measured relative to the target positions, and the measurement data are treated to produce a 2-dimensional displacement error map $\Delta V(x, y)$ that describes the deviation of the resist features from the target positions, which is described relative to a predefined ideal 2-dimensional coordinate system. These values can also be described by separate x and y deviations. The measurement of the wafer registration values per mask printed at the corresponding imaging condition (e.g., numerical aperture and illumination scheme) allows the determination of a "scanner-aware" registration.

It is useful to design the layout of the registration ghost pattern targets with a feature element distribution close to the layout of the most critical layer patterns. Given a perfect alignment of the coordinate systems of two layers, the induced intra-field overlay errors caused by the mask and projection system can be determined by vectorial overlap of the results of both measurements.

In some implementations, the registration ghost pattern targets of two masks are printed into the same resist layer coated on a test wafer such that corresponding resist features are generated. The dose is adapted as described above. Using a registration measurement tool, the position offsets of the registration ghost pattern targets are determined and compared to target values. The respective differences are the local overlay errors.

In some implementations, the center of gravity of the corresponding registration ghost pattern targets are configured to be on top of each other. A feature symmetry measurement of the printed resist features is used for overlay error determination. In some implementations, wafer overlay between the interlaced patterns of two or more masks that are part of a double exposure layer is determined. The two or more masks are printed on the same layer and the resulting pattern is an interlace of the two or more masks.

Figure 19:
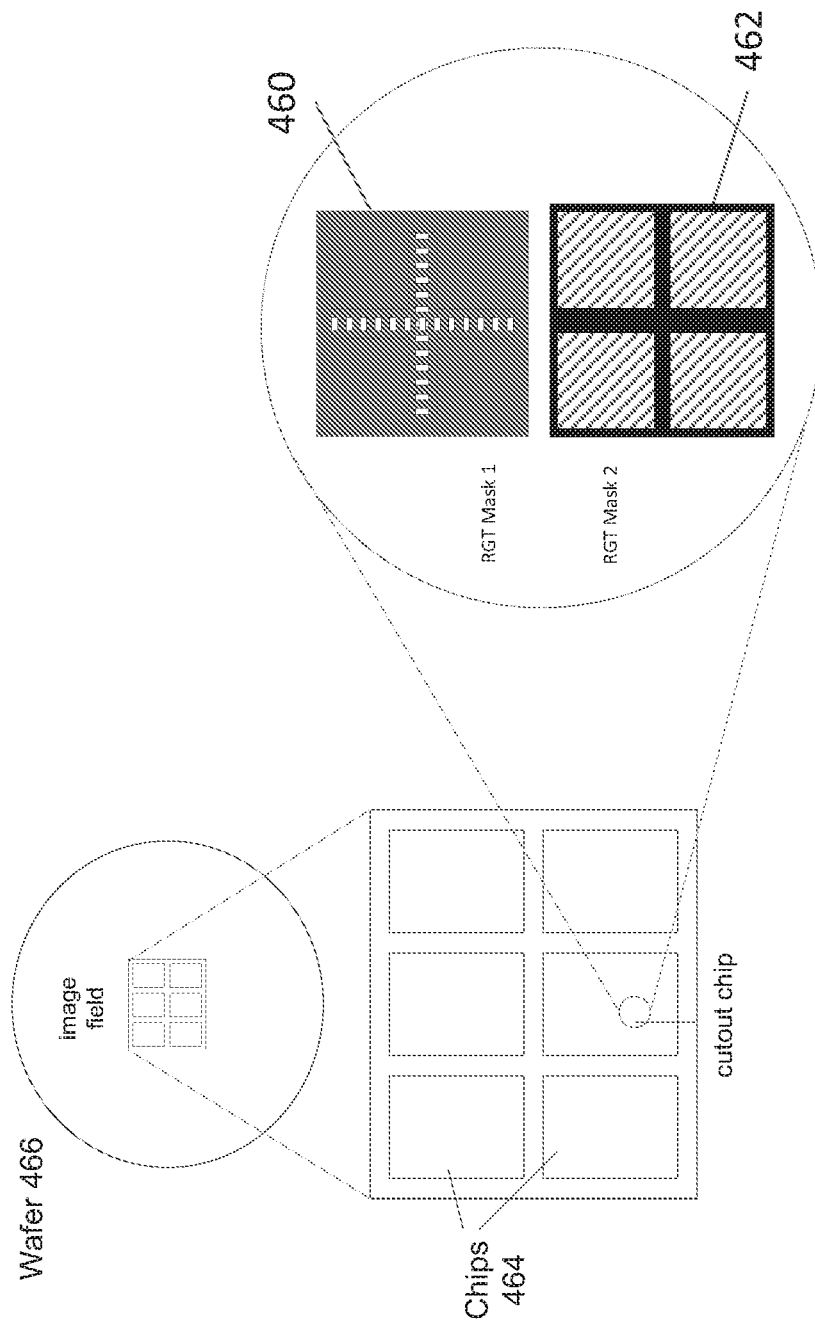
FIG. 19 is a diagram showing the placement of two registration ghost pattern targets on two photo masks.

FIG. 19 is a diagram showing the placement of two registration ghost pattern targets 460 and 462 on two photo masks (each of the targets at one mask) at approximately the same coordinates (with small offsets) on respective masks. The two registration ghost pattern targets 460 and 462 are implemented within the layout of the chips 464 and have different features that do not overlap when the overlay between the two photo masks is accurate (also in part because the two registration ghost pattern targets 460 and 462 do not have exactly the same coordinates). In this example, the registration ghost pattern target 460, when printed on the wafer 466 by itself, includes a cross-shaped pattern in which each of the vertical and horizontal main bars is composed of a chain of openings 464. The registration ghost pattern target 462, when printed on the wafer 466 by itself, includes a dark cross-shaped pattern 466, a dark outer boundary 468, and four quarter surroundings 469 having slanted lines.

The masks are over-exposed one after the other to transfer the registration ghost pattern targets 460, 462 onto the wafer 466. Suppose the registration ghost pattern targets 460 and 462 are designed to have offsets $\delta x1$ and $\delta y1$ relative to each other, and the printed registration ghost pattern targets have offsets $\delta x2$ and $\delta y2$ relative to each other, then $\delta x2-\delta x1$ and $\delta y2-\delta y1$ are the overlay errors in the x and y directions, respectively. Other registration ghost pattern targets can also be used.

Figure 20:
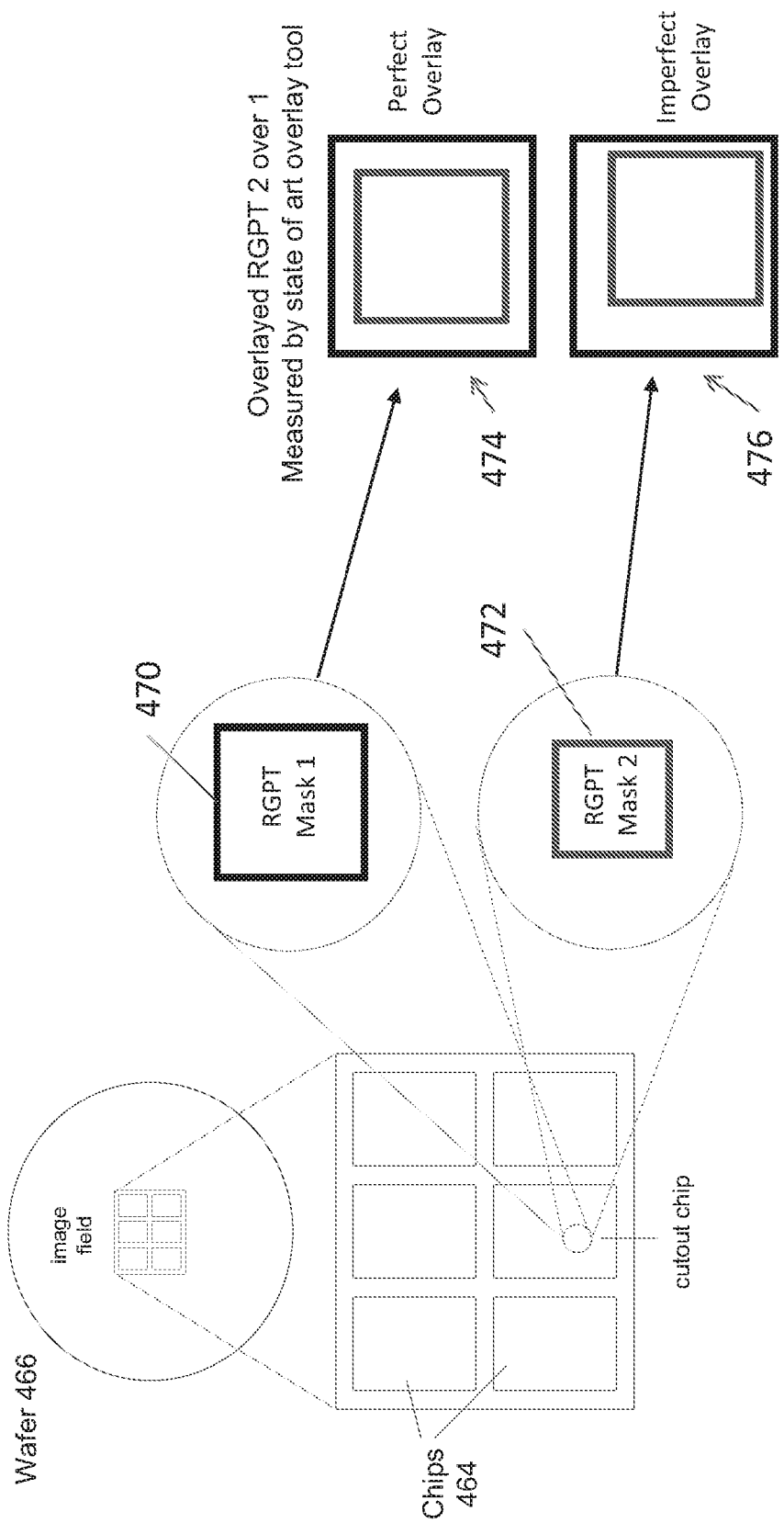
FIG. 20 is a diagram showing the placement of two wafer overlay ghost pattern targets from two photo masks.

FIG. 20 is another diagram showing the placement of two wafer overlay ghost pattern targets 470 and 472 from two photo masks (one at each mask) at the same coordinates on respective masks. The wafer overlay ghost pattern targets 470 and 472 can include, e.g., lines or small openings that have designs comparable to critical features of the corresponding active layout features, i.e., the same or comparable pitch but smaller size such that they do not print at nominal exposure dose and within a predefined relative dose variation range of the nominal exposure dose. In FIG. 20, only the borders of the wafer overlay ghost pattern targets 470 and 472 are shown, the details of the patterns are not shown.

As shown in this example, the wafer overlay ghost pattern targets 470 and 472, when printed on the wafer 466, form a larger box and a smaller box, respectively. If the overlay is accurate, a "box in box" configuration will appear on the wafer 466, as shown in the configuration 474, in which the center of gravity of the smaller box is perfectly aligned with the center of gravity of the larger box. When the overlay is not accurate, the center of gravity of the smaller box is not aligned with the center of gravity of the larger box, as shown in the configuration 476. The microstructures of the wafer overlay ghost pattern targets 470 and 472 can be similar to the microstructures of the registration ghost pattern targets described above. The choice of the microstructures depends from the mask and feature type.

A feature of a set of masks having the registration ghost pattern targets 460, 462 in FIG. 19, and a set of masks having the overlay ghost pattern targets 470, 472 in FIG. 20, is that the set of masks can be used for production purposes because the registration ghost pattern targets do not print at nominal exposure conditions.

In some implementations, the overlay errors can be determined by measuring and comparing the registration errors of two sets of registration ghost pattern targets printed on two different wafers. For example, suppose a first registration ghost pattern target printed on a first wafer is offset by 1 nm in the x-direction from its intended position, and a second registration ghost pattern target printed on a second wafer is also offset by 1.2 nm in the x-direction from its intended position, there is a 0.2 nm local overlay error in the x-direction for the first and second registration ghost pattern targets.

Figure 21:
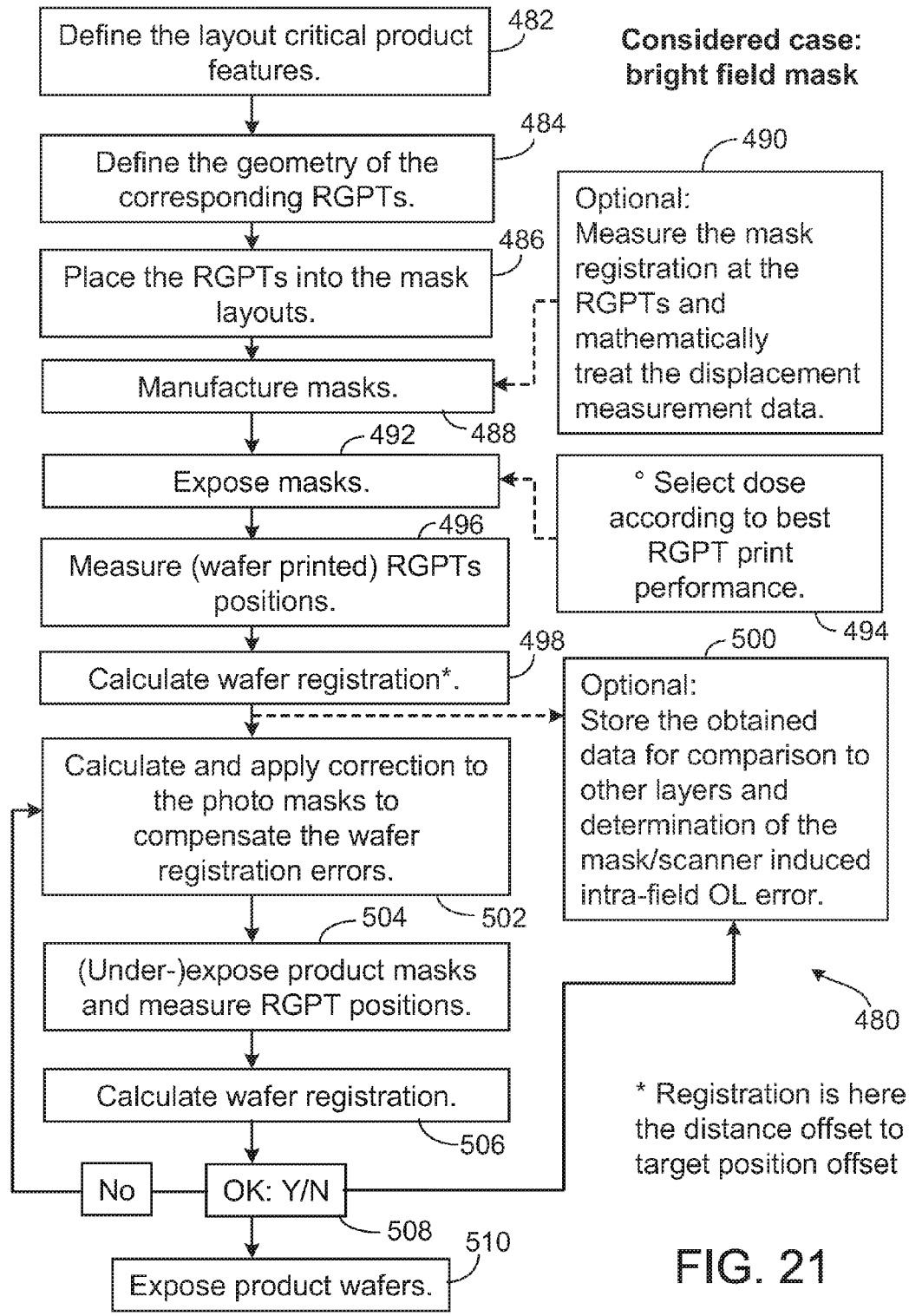
FIG. 21 is a flow diagram of a scanner-aware printed registration ghost pattern target overlay improvement process using registration ghost pattern targets.

FIG. 21 is a flow diagram of a scanner-aware printed registration ghost pattern target overlay improvement process 480 using registration ghost pattern targets. In this example, bright field masks are used. In the process 480, optionally, the layout critical product features for two or more photo masks are defined 482. The geometry of the corresponding registration ghost pattern targets on the two or more photo masks are defined 484. The registration ghost pattern targets are placed into respective mask layouts 486. The masks are manufactured 488. Optionally, the mask registration is measured at the registration ghost pattern targets and the displacement measurement data are processed using mathematical algorithms to determine the displacement of features 490.

The two or more photo masks are exposed to print the registration ghost pattern targets on photoresist layers of wafers 492. Each photo mask is used to print the registration ghost pattern targets on the mask on a separate wafer, and different masks are used to print on different wafers. The exposure dose is selected to result in the best registration ghost pattern target print performance 494. The positions of the wafer-printed registration ghost pattern targets are measured 496. Registration at the wafer level is calculated 498.

Here, a registration tool measures the wafer registration of the registration ghost pattern targets printed with one mask, and offsets between the targets. Differences in the wafer registration of different wafers can be used to determine differences in registration between different layers of the circuit, which provides information on the overlay errors between the different circuit layers. The overlay errors determined from wafer registration ghost pattern targets of two masks can be corrected by optimizing the registration of one or both masks. Optionally, the obtained data are stored for comparison to other layers and determination of the mask/scanner induced intra-field overlay error 500.

The amount of correction that needs to be applied to the photo masks in order to compensate the overlay errors is determined, and the correction is applied to the photo masks 502. After registration error correction, the masks are exposed to print the wafer registration ghost pattern targets in a new photoresist layer, and the positions of the wafer registration ghost pattern targets are again measured 504. Wafer registration is calculated 506. The registration is evaluated to determine whether the overlay meets a predetermined quality standard 508. If the overlay meets the quality standard, the photo masks are used for product wafer exposure 510. If the overlay does not meet the quality standard, then steps 502, 504, and 506 are repeated until the registration meets the quality standard, or other end-of-iteration criteria are met. Optionally, registration data for the corrected photo masks can be stored for later comparison 500.

Advantages of using the ghost pattern targets described above may include one or more of the following. Measurement of metrics of interest can be made directly in the region of interest (e.g., areas having active circuit components) of the actual production mask. The ghost pattern targets allow measurements to be made directly in the dies and allow production of uniformity maps of metrics that cannot be measured if patterns that print under nominal exposure conditions were used.

As a result of using the techniques described above, the field uniformity maps can be more accurate and can serve for accurate control, which results in better yield and performance of the chips on wafers. There can be significant cost reductions by saving the time required for producing test masks and measuring and/or printing the test masks.

Figure 22:
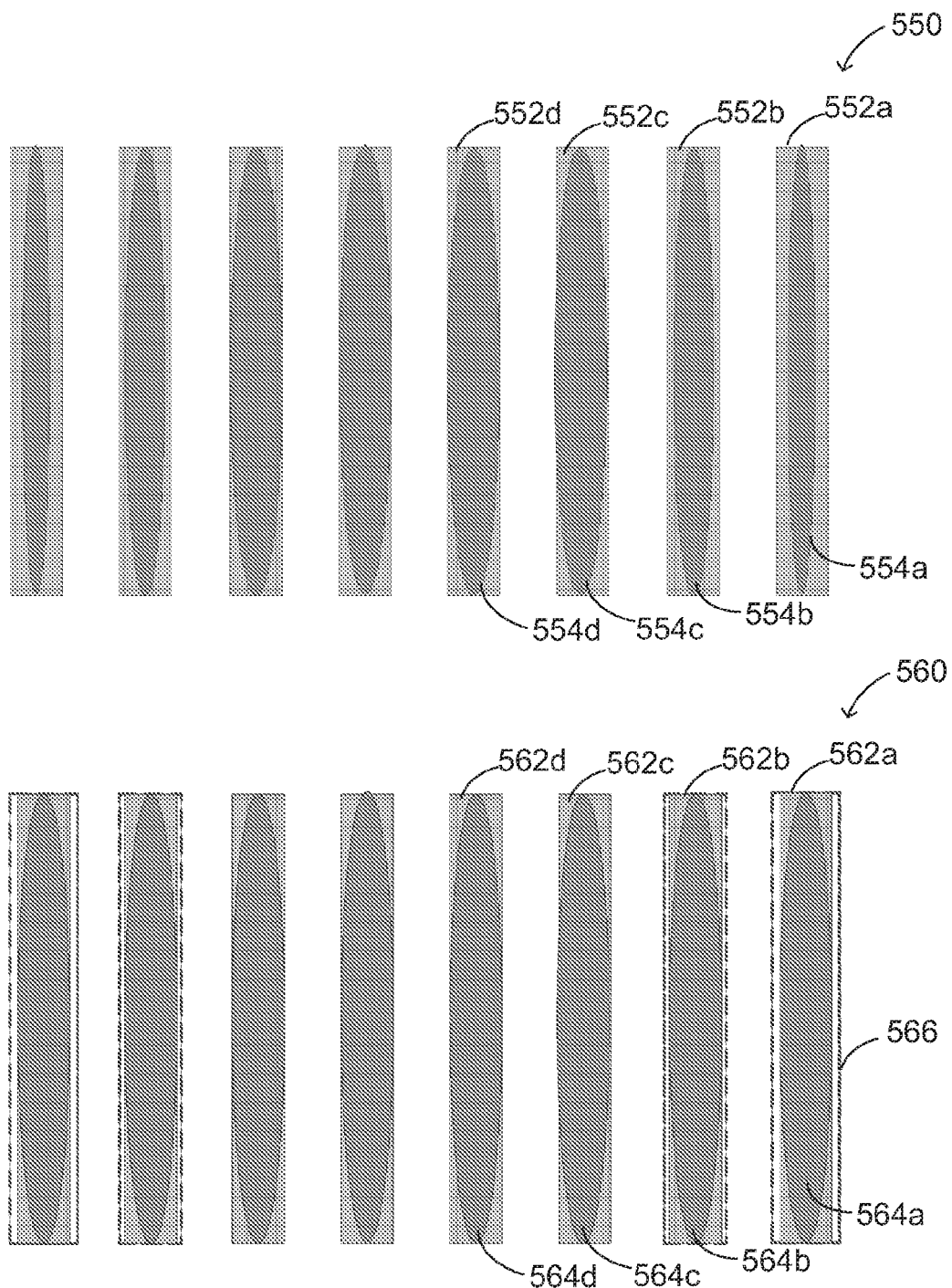
FIG. 22 is a diagram showing distortions in the measurements of ghost pattern targets caused by optical proximity effects.

Referring to FIG. 22, optical proximity effects may cause distortions in the measurements of ghost pattern targets. For example, a mask having a ghost pattern target may include a line/space array 550 having long dark lines 552a, 552b, 552c, and 552d (collectively referenced as 552) with the same width. When the mask is examined using an optical imaging tool (e.g., AIMS/WLCD) to measure the widths of the lines 552, the aerial images of the lines 554a, 554b, 554c, and 554d (collectively referenced as 554) may be distorted. The aerial image of a line will be referred to as an "aerial image line." Each aerial image line 554 has an oval shape, and the width of an aerial image line (e.g. 554a) near an outer side of the line/space array 550 is smaller than the width of an aerial image line (e.g., 554d) in a central region of the line/space array 550. The variance in the widths of the aerial image lines 554 introduces errors in calculating the average critical dimension and the critical dimension distribution across the photo mask.

The errors are significant for ghost pattern targets that have a small number of repeating features. The errors due to optical proximity effects can be made smaller by using a ghost pattern target that has a large number of repeating features, such as a line/space array having 50 or more dark lines. However, such a ghost pattern target has a large size, so there are fewer un-patterned areas on the photo mask that can accommodate the large ghost pattern target.

In order to use a small ghost pattern target having a small number of features, it is preferable to modify the geometry of the ghost pattern target to compensate for the optical proximity effect. This will be referred to as optical proximity correction. For example, a modified line/space array 560 having dark lines 562a, 562b, 562c, 562d (collectively referenced as 562) can be provided in which biases are applied to the widths of the dark lines 562 near the outer sides of the array 560. The widths of the lines (e.g., 562a) near the outer sides of the line/space array 560 are wider, as shown by the dashed line 566, than the widths of the lines (e.g., 562d) in the central region of the line/space array 560. The amount of optical proximity correction is designed such that when the line/space array 560 is examined using an optical imaging tool to measure the widths of the lines 562, the aerial images of the lines 564a, 564b, 564c, and 564d (collectively referenced as 564) have substantially the same width.

The same technique can be used when the ghost pattern targets are printed on a wafer and printed ghost pattern targets are measured to determine critical dimension uniformity.

The advantage of the optical proximity correction procedure is that the number of individual features needed in the ghost pattern target can be reduced, so the macro size of the ghost pattern target can be kept small. This allows more ghost pattern targets to be distributed throughout the image field for use in gathering critical dimension data.

An optical proximity correction process can also be applied to the circuit patterns on the photo mask. Application of optical proximity correction to the ghost pattern targets is performed independently of the optical proximity correction applied to circuit features. The target size of the correction process for the ghost pattern target is the designed ghost pattern target feature size. The target size of the correction process for the circuit pattern is the designed circuit pattern feature size.

The implementation of the ghost pattern targets into the mask layout is performed after the optical proximity correction process is applied to the circuit patterns. This ensures that the ghost pattern targets are indeed placed in un-patterned areas in the photo mask.

Figure 23:
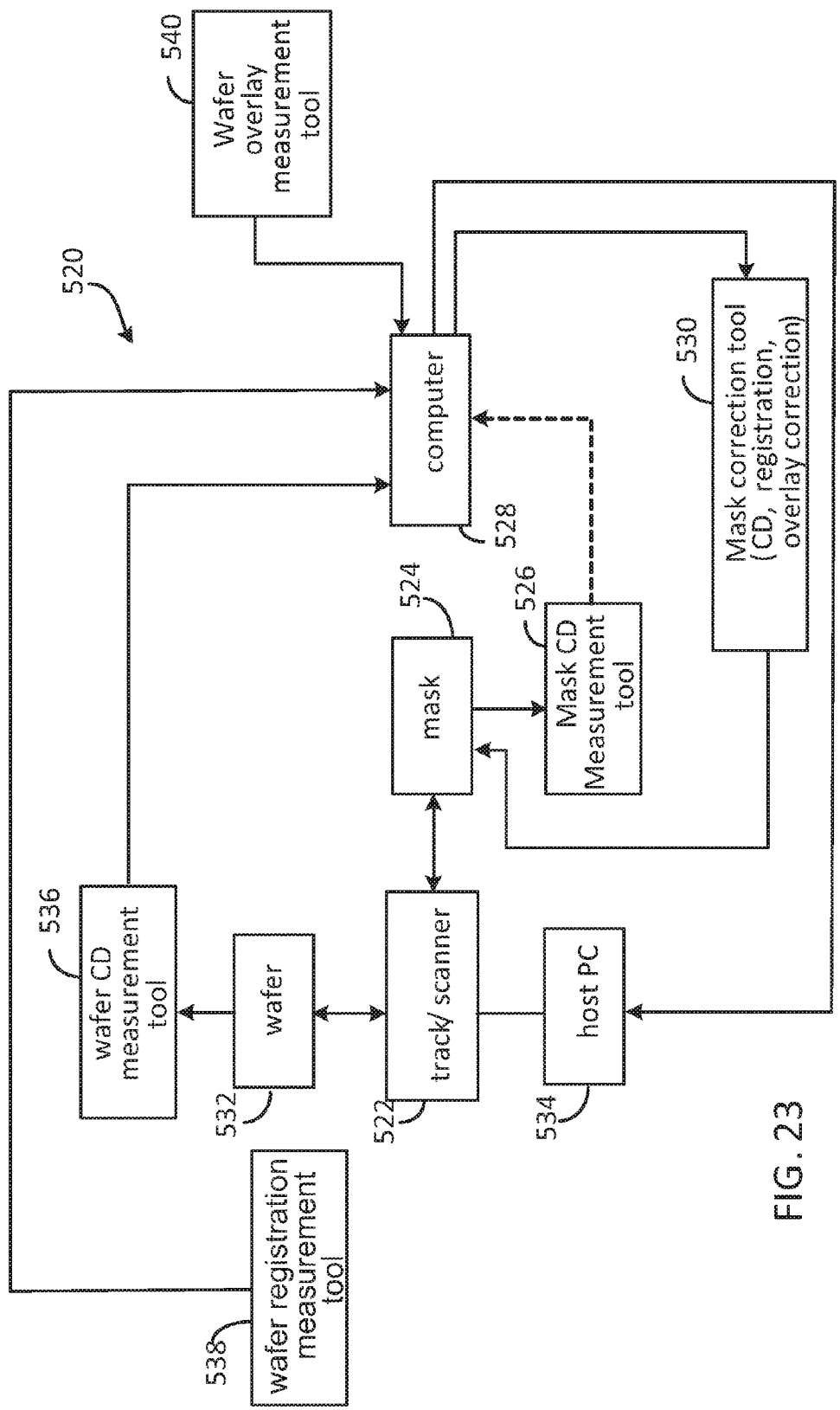
FIG. 23 is a block diagram of an example system for using ghost pattern targets to improve critical dimension uniformity.

FIG. 23 is a block diagram of an example system 520 for using ghost pattern targets to improve critical dimension uniformity. The system 520 includes a host personal computer 534 that controls a scanner 522, which provides light to illuminate a mask 524 and images the mask content onto a wafer to print features on the wafer. Ghost pattern targets projected from the mask 524 are measured using a mask critical dimension measurement tool 526. The measurement data are sent to a computer 528 for analyses. The computer 528 controls a mask correction tool 530 that modifies portions of the mask 524 to improve critical dimension uniformity.

The host PC 534 can also control the scanner to cause the mask 524 to be exposed using an under-exposure or over-exposure to cause the ghost pattern targets to be transferred to a wafer 532. The ghost pattern targets on the wafer 532 are measured using a wafer critical dimension measurement tool 536. The measurement data are sent to the computer 528 for analyses. The computer 528 controls the mask correction tool 530 to modify the mask blank transmittance of the mask 524 to improve critical dimension uniformity.

A wafer registration measurement tool 538 measures the registration ghost pattern targets printed on the wafer. The measurement data are sent to the computer 528 for analyses. The computer 528 controls the mask correction tool 530 and determines the pixel writing density needed to correct the wafer registration errors. A wafer overlay measurement tool 540 measures the wafer-overlay ghost pattern targets printed on the wafer. The measurement data are sent to the computer 528 for analyses. The computer 528 controls the mask correction tool 530 and determines the pixel writing density needed to correct the wafer overlay errors.

In the description above, the ghost pattern targets are used to collect critical dimension uniformity data, which is used to apply correction to the photo mask and/or scanner in order to improve the critical dimension uniformity of integrated circuits fabricated on the wafer. In some implementations, the ghost pattern targets can also be used by a mask house that manufactures photo masks to improve its process for fabricating the photo masks, in order to improve the mask critical dimension uniformity and mask registration performance. Because the ghost pattern targets do not print under nominal exposure conditions, the mask house upon obtaining consent from the customer that ordered the photo mask can add ghost pattern targets to the photo mask in order to improve the quality of the photo mask, prior to supplying the photo mask to the customer.

In some implementations, the photo mask may include two sets of ghost pattern targets, the first set being used by the mask house for improving the quality of the photo mask prior to delivering the photo mask to the buyer or owner of the photo mask. The second set of ghost pattern targets can be used by the owner of the photo mask for improving the quality of integrated circuits fabricated on the wafer.

Ghost pattern targets can be used to collect data on critical dimension uniformity for use in tools or processes that use a localized dose adjustment in the scanner while exposing the wafer in order to compensate contributions by the photo mask to critical dimension non-uniformity, thereby improving critical dimension uniformity at the wafer level. For example, ghost pattern targets can be used in a Dose Mapper (DOMA) scanner or process (available from ASML, the Netherlands) in which intra-field critical dimension variation is corrected through wafer critical dimension data feedback to the scanner.

The features described above related to processing of data can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems.

The ghost patterns can be different from those described above. More than one type of ghost patterns can be used in the same photo mask. The ghost patterns can be positioned in a patterned area of sufficient size. For example, bright ghost pattern targets can be implemented in dark active features of sufficient size, and dark ghost pattern targets can be implemented in bright active features of sufficient size. A negative tone photoresist can also be used when using ghost pattern targets to improve critical dimension uniformity, registration, and overlay. When a negative tone photoresist is used, the portion of the photoresist that is exposed to light becomes insoluble to the photoresist developer, while the unexposed portion of the photoresist is dissolved by the photoresist developer.

The ghost pattern targets can be implemented in reflective type photo masks used in extreme ultraviolet lithography. A reflective type photo mask has a highly reflective surface, and features are placed on thin absorbing or semi-absorbing lamellas that, through their 2D extension and lateral distribution, encode information needed for manufacturing integrated devices.

Accordingly, other implementations are within the scope of the following claims.

What is claimed is:

1. A method comprising:
providing a first photo mask having a first set of patterns and a second set of patterns, the first set of patterns corresponding to a circuit pattern to be fabricated on a wafer, the second set of patterns having dimensions such that the second set of patterns do not contribute to the circuit pattern that is produced using a lithography process based on the first set of patterns under a first exposure condition; and
determining critical dimension distribution of the first photo mask based on the second set of patterns that do not contribute to the circuit pattern produced using the lithography process based on the first set of patterns under the first exposure condition.

2. The method of claim 1 in which the first photo mask is part of a set of photo masks used to fabricate a circuit on the wafer, and at least some of the patterns in the second set of patterns are located at positions that correspond to circuit components.

3. The method of claim 1 in which determining critical dimension distribution of the first photo mask based on the second set of patterns comprises projecting the second set of patterns onto a detector under a second exposure condition that is different from the first exposure condition, and analyzing images detected by the detector.

4. The method of claim 3 in which the first exposure condition specifies a first range of exposure dose, the second exposure condition specifies a second range of exposure dose, and the second range is outside of the first range.

5. The method of claim 1 in which determining critical dimension distribution of the first photo mask based on the second set of patterns comprises projecting the second set of patterns onto a photoresist layer under a second exposure condition that is different from the first exposure condition, and analyzing the patterns on the photoresist layer.

6. The method of claim 5 in which the first exposure condition specifies a first range of exposure dose, the second exposure condition specifies a second range of exposure dose, and the second range is outside of the first range.

7. The method of claim 1 in which the first set of patterns comprises opaque lines having a first minimum width, and the second set of patterns comprises opaque lines having a second width that is less than the first minimum width.

8. The method of claim 7 in which the second set of patterns comprises groups of opaque lines, each group having patterns that are identical to other groups, the groups being distributed across the first photo mask in open spaces defined by the first set of patterns.

9. The method of claim 1 in which the first set of patterns comprises a first arrangement of contact openings, the second set of patterns comprises a second arrangement of openings, each opening in the second arrangement of openings being smaller than a corresponding opening in the first arrangement of contact openings.

10. The method of claim 9 in which the first arrangement of contact openings comprises a first chain of contact openings, the second arrangement of openings comprises a second chain of openings, each opening in the second chain of openings being smaller than a corresponding opening in the first chain of contact openings.

11. The method of claim 1 in which the first set of patterns comprises line openings having a first minimum width, and the second set of patterns comprises line openings having a second width that is less than the first minimum width.

12. The method of claim 1 in which the first set of patterns comprises a first arrangement of features that correspond to contact openings, the second set of patterns comprises a second arrangement of features, each feature in the second arrangement of features being smaller than a corresponding feature in the first arrangement of features.

13. The method of claim 1 in which the first set of patterns comprises a third pattern, and the second set of patterns comprises a fourth pattern that has a same shape as the third pattern but rotated at a first angle relative to the third pattern.

14. The method of claim 13 in which determining critical dimension distribution of the first photo mask based on the second set of patterns comprises projecting the second set of patterns onto a detector or a photoresist layer under a second exposure condition, the first exposure condition comprising using an asymmetrical illumination in which an illumination source for the asymmetrical illumination has a first orientation relative to a lithography scanner, and the second exposure condition comprising using the illumination source rotated to the first angle relative to the orientation of the illumination source in the first exposure condition, the asymmetrical illumination providing lighting that changes when the asymmetrical illumination is rotated relative to the scanner.

15. The method of claim 14 in which the asymmetric illumination comprises at least one of a dipole illumination, a quadrupole illumination, or a hexapole illumination.

16. The method of claim 13 in which the fourth pattern is rotated 90 degrees relative to the first pattern.

17. The method of claim 1, comprising applying optical proximity correction to the second set of patterns.

18. The method of claim 17 in which applying optical proximity correction comprises applying optical proximity correction to the second set of patterns prior to incorporating the second set of patterns in the first photo mask.

19. The method of claim 17, comprising applying optical proximity correction to the first set of patterns prior to applying optical proximity correction to the second set of patterns.

20. The method of claim 17 in which a target critical dimension of the optical proximity correction is a target size of the second set of patterns.

21. The method of claim 17 in which the optical proximity correction is performed based on aerial image measurements.

22. The method of claim 17 in which the optical proximity correction is performed based on resist feature measurements.

23. The method of claim 1, comprising improving a process for manufacturing the first photo mask using information about the critical dimension distribution of the first photo mask determined based on the second set of patterns.

24. The method of claim 1 in which the photo mask comprises an optically transmissive mask.

25. The method of claim 1 in which the photo mask comprises a reflective mask.

26. The method of claim 25, comprising irradiating the photo mask with a radiation having a wavelength in a range between 0.1 nm to 700 nm when printing the first set of patterns.

27. The method of claim 26 in which the radiation has a wavelength in a range between 1 nm to 10 nm.

28. A method comprising:
providing a first photo mask having a first pattern and a second pattern, the first pattern corresponding to a circuit pattern to be fabricated on a wafer, the second pattern having dimensions such that the second pattern does not contribute to the circuit pattern that is produced using a lithography process based on the first pattern under a first exposure dose; and measuring exposure system aware mask registration using the second pattern under a second exposure dose different from the first exposure dose to determine both displacement errors of features on the first photo mask and exposure tool induced displacement errors.

29. The method of claim 28 in which the second pattern comprises an overall cross-shape pattern having a first sub-pattern extending along a first direction and a second sub-pattern extending along a second direction, the first bar intersecting the second bar, and the first sub-pattern has a plurality of segments.

30. The method of claim 28 in which the second pattern comprises an overall cross-shape pattern having a first bar extending along a first direction and a second bar extending along a second direction, the first bar intersecting the second bar, and the first bar comprising a plurality of parallel lines each having a length comparable to the length of the first bar and a width smaller than the width of the first bar.

31. The method of claim 28 in which the second pattern comprises a registration mark and a third pattern adjacent to the registration mark, the third pattern having a plurality of regularly spaced components that enables measurement of the exposure tool induced displacement errors.

32. The method of claim 28 in which the second pattern comprises a cross-shaped registration mark and patterns having a plurality of regularly spaced components at upper-left, upper-right, lower-left, and lower-right quarter surroundings of the cross-shaped registration mark to enable measurement of the exposure tool induced displacement errors.

33. The method of claim 32 in which the cross-shaped registration mark comprises an opaque cross-shaped pattern.

34. The method of claim 32 in which the cross-shaped registration mark comprises a cross-shaped spacing defined by the patterns having the plurality of regularly spaced components at upper-left, upper-right, lower-left, and lower-right quarter surroundings.

35. The method of claim 28 in which measuring exposure system aware mask registration using the second pattern under a second exposure dose comprises printing the second pattern on a wafer under the second exposure dose.

36. The method of claim 28 in which the first photo mask comprises an optically transmissive mask.

37. The method of claim 28 in which the first photo mask comprises a reflective mask.

38. The method of claim 37, comprising irradiating the first photo mask with a radiation having a wavelength in a range between 0.1 nm to 700 nm when printing the first set of patterns.

39. The method of claim 38 in which the radiation has a wavelength in a range between 1 nm to 10 nm.

40. A method comprising:
providing a first photo mask having a first pattern and a second pattern, the first pattern corresponding to a first circuit pattern to be fabricated on a wafer, the second pattern having dimensions such that the second pattern does not contribute to the first circuit pattern that is produced using a lithography process based on the first pattern under a first exposure condition; providing a second photo mask having a third pattern and a fourth pattern, the third patterns corresponding to a second circuit pattern to be fabricated on the wafer, the fourth pattern having dimensions such that the fourth pattern does not contribute to the second circuit pattern that is produced using a lithography process based on the third patterns under a third exposure condition;
printing the second pattern on a photoresist layer under a second exposure condition;
printing the fourth pattern on the photoresist layer under a fourth exposure condition; and
determining overlay error between the second and fourth patterns printed on the photoresist layer.

41. The method of claim 40 in which each of the second and fourth patterns comprises a registration target that can be recognized by a registration measurement tool.

42. The method of claim 40 in which the second pattern comprises a registration target that can be used to determine a displacement error of a feature on the first photo mask.

43. The method of claim 42 in which the fourth pattern comprises a registration target that can be used to determine a displacement error of a feature on the second photo mask.

44. The method of claim 40 in which the first photo mask comprises an optically transmissive mask.

45. The method of claim 40 in which the first photo mask comprises a reflective mask.

46. The method of claim 45, comprising irradiating the first photo mask with a radiation having a wavelength in a range between 0.1 nm to 700 nm when printing the first circuit pattern.

47. The method of claim 46 in which the radiation has a wavelength in a range between 1 nm to 10 nm.

48. A method comprising:
providing a first photo mask having a first pattern and a second pattern, the first pattern corresponding to a first circuit pattern to be fabricated on a wafer, the second pattern having dimensions such that the second pattern does not contribute to the first circuit pattern that is produced using a lithography process based on the first pattern under a first exposure condition; providing a second photo mask having a third pattern and a fourth pattern, the third patterns corresponding to a second circuit pattern to be fabricated on the wafer, the fourth pattern having dimensions such that the fourth pattern does not contribute to the second circuit pattern that is produced using a lithography process based on the third pattern under a third exposure condition, the first and second circuit patterns being associated with an overall circuit pattern;
printing the second pattern on a first wafer under a second exposure condition;
printing the fourth pattern on a second wafer under a fourth exposure condition;
measuring registration of the second pattern on the first wafer;
measuring registration of the fourth pattern on the second wafer; and
determining an overlay error between the second and fourth patterns based on the measurements of the wafer registration of the second pattern and the wafer registration of the fourth pattern.

* * * * *